United States Patent [19]
Izawa et al.

[11] Patent Number: 5,637,995
[45] Date of Patent: Jun. 10, 1997

[54] MAGNETIC DETECTION DEVICE HAVING A MAGNET INCLUDING A STEPPED PORTION FOR ELIMINATING TURBULENCE AT THE MR SENSOR

[75] Inventors: Ichiro Izawa, Anjo; Yasuaki Makino, Okazaki; Susumu Kuroyanagi, Anjo; Seiki Aoyama, Toyohashi; Shigehiro Kasumi, Kariya; Kenji Yagi, Nagoya; Kazuo Kajimoto, Okazaki; Masaki Takashima, Nukata-gun, all of Japan; Shinichi Konda, München, Germany

[73] Assignee: Nippondenso Co., Ltd., Kariya, Japan

[21] Appl. No.: 407,999

[22] Filed: Mar. 21, 1995

Related U.S. Application Data

[63] Continuation-in-part of Ser. No. 162,625, Dec. 7, 1993, abandoned.

[30] Foreign Application Priority Data

| Dec. 9, 1992 | [JP] | Japan | 4-329670 |
| Dec. 18, 1992 | [JP] | Japan | 4-339275 |
| May 10, 1993 | [JP] | Japan | 5-108542 |
| Mar. 23, 1994 | [JP] | Japan | 6-052153 |
| Jun. 17, 1994 | [JP] | Japan | 6-135783 |

[51] Int. Cl.$^6$ .............. G01P 3/487; G01R 33/09; G01B 7/14
[52] U.S. Cl. .............. 324/174; 324/207.21; 324/207.25
[58] Field of Search .............. 324/207.21, 207.12, 324/262, 252, 207.2, 251, 260, 207.25, 173, 174; 338/32 P, 32 H

[56] References Cited

U.S. PATENT DOCUMENTS

| 4,296,376 | 10/1981 | Bartol, Jr. | 324/133 |
| 4,492,922 | 1/1985 | Ohkubo | 324/207.21 |
| 4,922,197 | 5/1990 | Juds et al. | 324/207.21 |
| 5,115,194 | 5/1992 | Luetzow et al. | 324/207.2 |
| 5,134,371 | 7/1992 | Watanabe et al. | |
| 5,321,355 | 6/1994 | Luetzow | 324/207.21 |
| 5,325,056 | 6/1994 | Shonowaki et al. | 324/207.21 |

FOREIGN PATENT DOCUMENTS

| 266585 | 5/1988 | European Pat. Off. |
| 52-157729 | 5/1977 | Japan |
| 54-138457 | 10/1979 | Japan |
| 55-24615 | 2/1980 | Japan |
| 55-149971 | 4/1980 | Japan |
| 58-45501 | 3/1983 | Japan |
| 61-92414 | 5/1986 | Japan |
| 62-148813 | 7/1987 | Japan |
| 63-184012 | 7/1988 | Japan |
| 63-205515 | 8/1988 | Japan |
| 6479614 | 3/1989 | Japan |
| 2262008 | 10/1990 | Japan |
| 3195970 | 8/1991 | Japan |

*Primary Examiner*—Sandra L. O'Shea
*Assistant Examiner*—Roger Phillips
*Attorney, Agent, or Firm*—Cushman, Darby & Cushman IP Group of Pillsbury Madison & Sutro LLP

[57] ABSTRACT

A magnetic detection device including a biasing magnet for generating a bias magnetic field directed to an object of detection having a magnetic material; a magnetoresistance effective element disposed at an inclination of about 45° to the direction of the bias magnetic field to provide a change in resistance caused by the bias magnetic field in accordance with movement of the object of detection, so as to detect a change in state of the bias magnetic field via the change in resistance of the magnetoresistance effective element; and the biasing magnet having a hollow portion containing a holder for holding the magnetoresistance effective element in a position between a surface of the biasing magnet and the object of detection and close to the surface of the biasing element.

22 Claims, 25 Drawing Sheets

$R_7 = R_x \cos^2\theta + R_y \sin^2\theta$

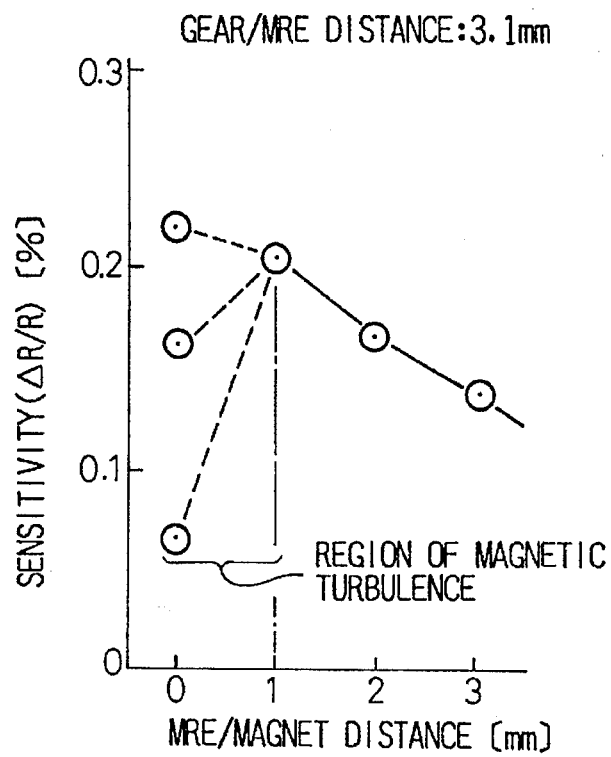
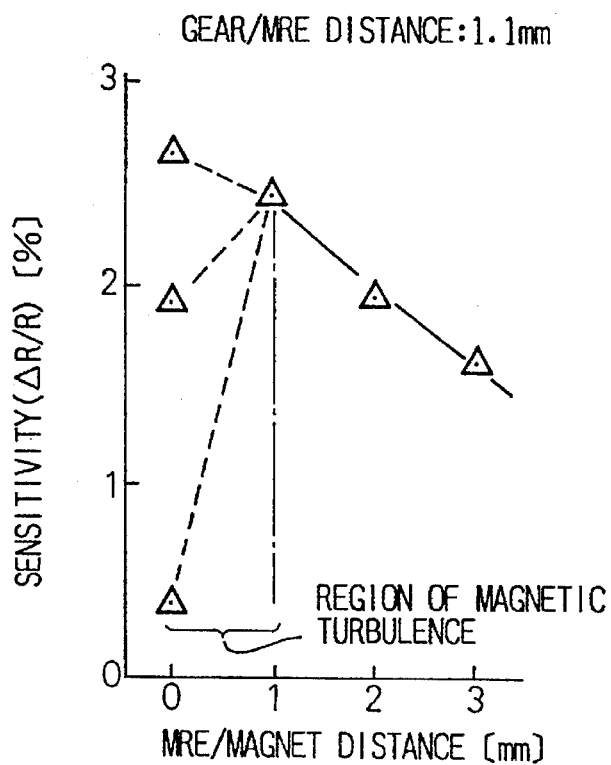

Fig.26
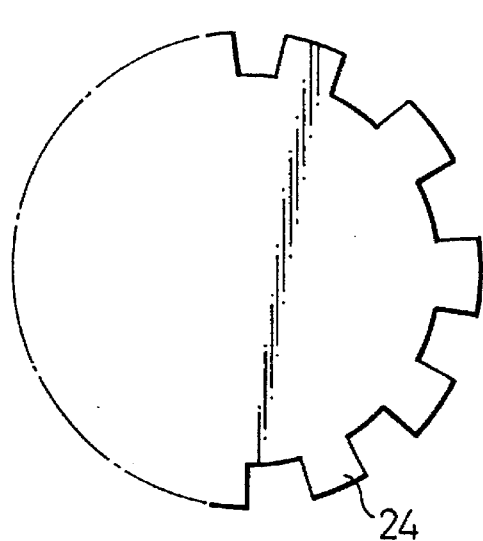
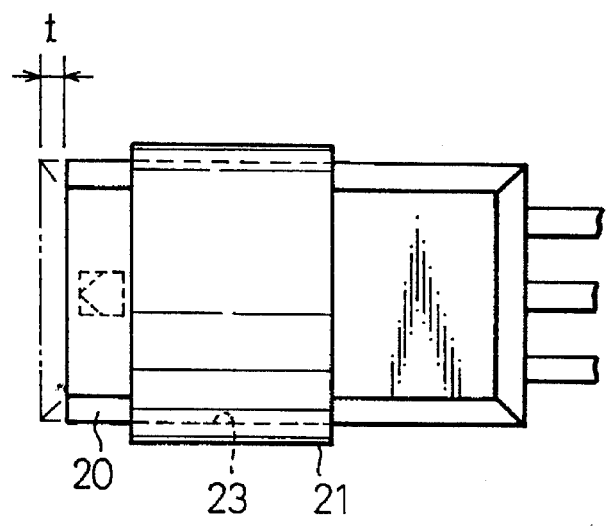

MAGNETIC DETECTION DEVICE HAVING A MAGNET INCLUDING A STEPPED PORTION FOR ELIMINATING TURBULENCE AT THE MR SENSOR

CROSS-REFERENCE TO RELATED APPLICATIONS

This application is a continuation-in-part application of U.S. Ser. No. 08/162,625 filed on Dec. 7, 1993 now abandoned.

BACKGROUND OF THE INVENTION

1. Field of the Invention

The present invention relates to a magnetic detection device for detecting a movement of an object of detection by utilizing a change in resistivity of a magnetoresistance effective element (MRE).

2. Description of the Related Art

Proximity rotation sensors mostly have a magnetic circuit structure in which a magnet for generating a bias magnetic field has the head plane lying parallel with a sensing element, i.e., the biasing magnet is mounted on the rear surface of the sensing element. This system periods detection by utilizing a deflection angle of the magnetic vector perpendicular to the direction of electric current through an MRE. At increased deflection angles, however, the output waveform undesirably involves division of a single wave peak into double wave peaks, causing malfunctioning.

To avoid occurrence of the divided or doubled wave peaks, U.S. Pat. No. 5,134,371 proposed a magnetic circuit structure in which a sensing element is disposed perpendicularly to the magnet head plane and contains MREs arranged at an inclination of about 45° to a bias magnetic field.

The proposed structure, however, has a problem in that MREs, when so arranged, exhibit reduced sensitivity.

SUMMARY OF THE INVENTION

The object of the present invention is to provide a magnetic detection device whereby the reduction of the sensitivity of MREs is minimized while occurrence of the divided or doubled wave peaks is avoided.

To achieve the object according to the present invention, there is provided a magnetic detection device comprising:
- a biasing magnet for generating a bias magnetic field directed to an object of detection having a magnetic material;
- a magnetoresistance effective element disposed at an inclination of about 45° to the direction of the bias magnetic field in accordance with movement of the object of detection, so as to detect a change in state of the bias magnetic field via the change in resistance of the magnetoresistance effective element; and
- the biasing magnet having a hollow portion containing a holder for holding the magnetoresistance effective element in a position between a surface of the biasing magnet and the object of detection and close to the surface of the biasing element.

A distance between the magnetoresistance effective element and the biasing magnet has an optimum value which is preferably a minimum distance for ensuring maximum output signal from the MRE while avoiding turbulence of a magnetic vector due to the presence of the hollow portion.

The biasing magnet may be composed of ferritic plastic magnet.

The magnetoresistance effective element may be molded in a molding package having a tip shaved or cut to form a thin edge thereby reducing the distance between the magnetoresistance effective element and the object of detection.

According to another aspect of the present invention, a magnetic detection device comprises:
- a biasing magnet for generating a bias magnetic field directed to an object of detection having a magnetic material;
- a magnetoresistance effective element disposed at an inclination of about 45° to the direction of the bias magnetic field to provide a change in resistance caused by the bias magnetic field in accordance with movement of the object of detection, so as to detect a change in state of the bias magnetic field via the change in resistance of the magnetoresistance effective element; and
- the biasing magnet having a side surface on which mounted is a holder for holding the magnetoresistance effective element in a position close to a surface of the biasing element.

According to a further aspect of the present invention, a magnetic detection device comprises:
- a hollow columnar biasing permanent magnet having a through hole extending in the axis thereof, the biasing magnet generating a bias magnetic field directed to an object of detection made of a magnetic material; and
- a pair of magnetoresistance effective elements held in a tip portion of a holder made of a non-magnetic material filling the through hole of the biasing magnet, the tip portion of the holder protruding from one end of the through hole to a minimum distance necessary for avoiding magnetic turbulence prevailing in the vicinity of ends of the through hole, the pair of magnetoresistance effective elements being disposed with their longitudinal axes of electric current inclined at respective angles of plus and minus about 45° to a direction of the bias magnetic field to provide a change in resistance caused by a change in the bias magnetic field in accordance with movement of the object of detection, thereby detecting a change in the state of the bias magnetic field via the change in the resistance of the magnetoresistance effective element.

BRIEF DESCRIPTION OF THE DRAWINGS

FIGS. 14 and 15 show the observed sensitivities of MREs;

FIG. 26 shows a preferred arrangement of a magnetic rotation detection device of Example 4 according to the present invention, in a front view;

DESCRIPTION OF THE PREFERRED EMBODIMENTS

EXAMPLE 1

An embodiment of the present invention will be described with reference to the attached drawings.

Figure 1:
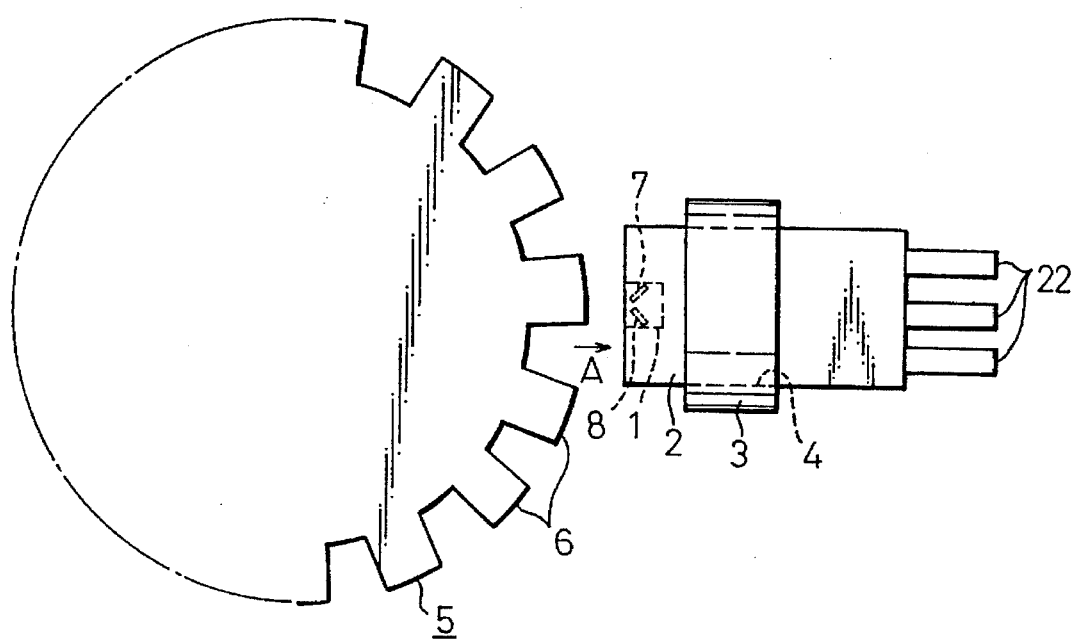
FIG. 1 shows a preferred arrangement of a magnetic rotation detection device of Example 1 according to the present invention, in a front view.
Figure 2:
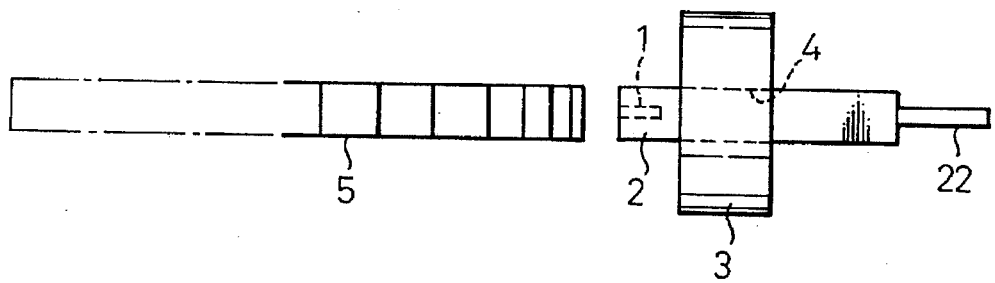
FIG. 2 shows the magnetic rotation detection device of FIG. 1, in a plan view.
Figure 3:
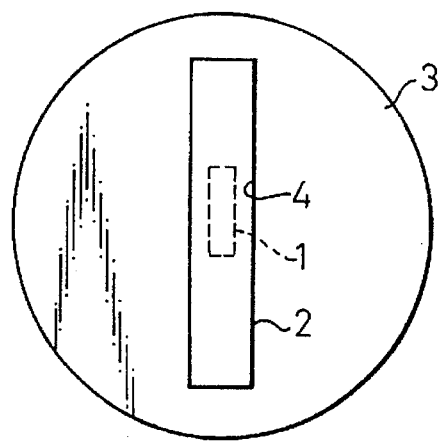
FIG. 3 shows the magnetic rotation detection device of FIG. 1, in a side view in the direction of the arrow "A"

FIG. 1 is a side view of a magnetic rotation detection device according to the present invention. FIG. 2 is a plan view of the device and FIG. 3 is a front view in the direction of the arrow "A" of FIG. 1.

A sensing element 1 is molded in the head portion of a molding material 2 in the form of a bar having a rectangular cross-section. Lead frames 22 are also molded in the molding material 2 and protrude rightward from the latter. In this example, the molding material 2 is an epoxy resin.

A round columnar biasing permanent magnet 3 has a rectangular through hole 4 extending along the longitudinal axis of the biasing magnet 3 to form a hollow portion. In this example, the biasing magnet 3 is a ferritic plastic magnet.

The molding material 2 is fittingly inserted and fixed by an adhesive in the through hole 4 of the biasing magnet 3.

Figure 4:
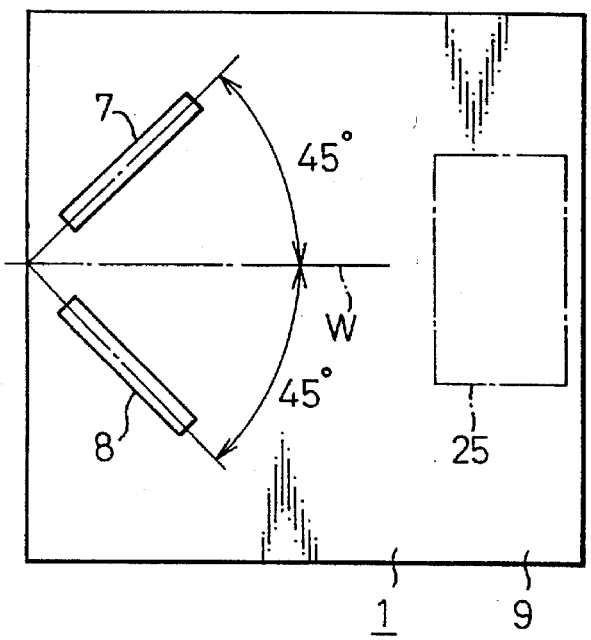
FIG. 4 shows a sensing element in a front view.

A gear 5 having numerous gear teeth 6 is an object of detection. The sensing element 1 is located so as to face the teeth 6 of the gear 5. As shown in FIG. 4, the sensing element 1 has a chip 9 containing two magnetoresistance effective elements (MREs) 7 and 8 which are disposed perpendicular to the side surface of the magnet 3 and in parallel with a plane of the rotation direction of the gear 5. The pair of MREs 7 and 8 are disposed in the chip 9 in a plane containing the direction "W" of the magnetic field of the biasing magnet 3 and at inclinations of plus and minus about 45° to the direction "W" of the magnetic field of the biasing magnet 3.

The molding material 2 and the sensing element 1 are aligned on the center line of the gear 5, as shown in FIG. 2.

Magnetic detection is effected in the following manner.

Figure 5:
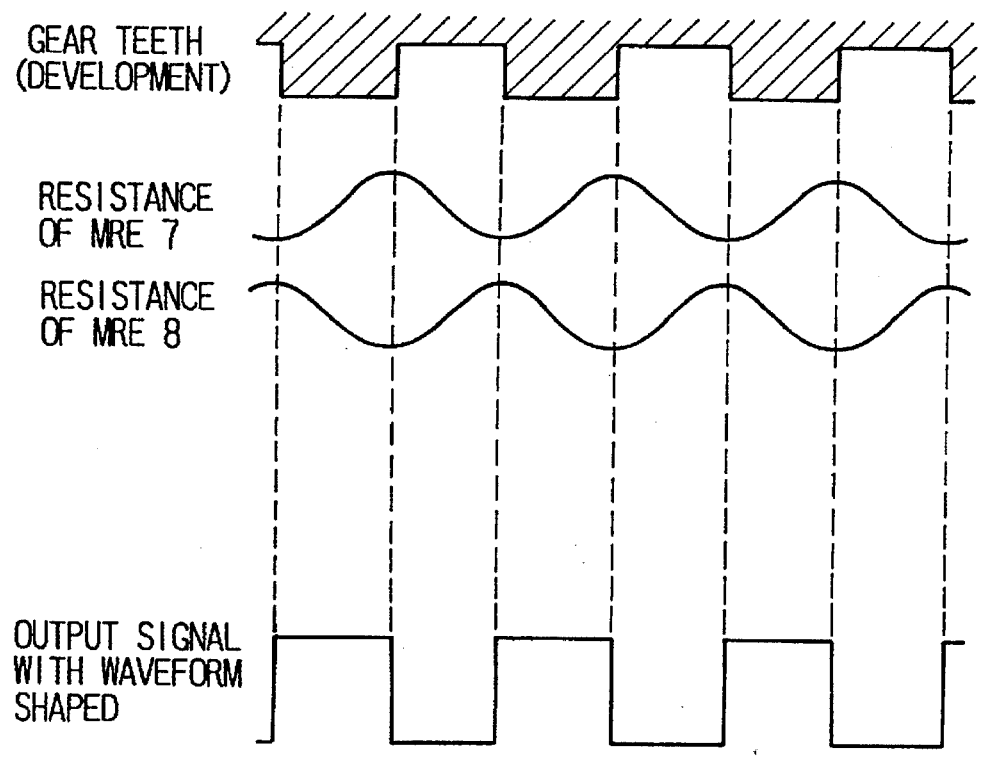
FIG. 5 is a time chart showing processing of signals.
Figure 6:
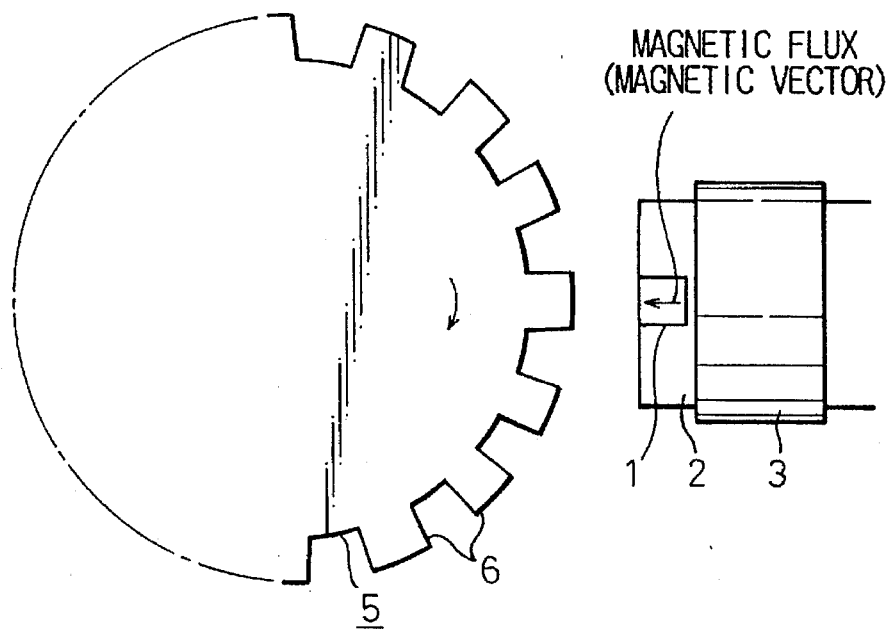
FIGS. 6 to 9 show the variation of a magnetic vector as a gear rotates, in front views.
Figure 7:
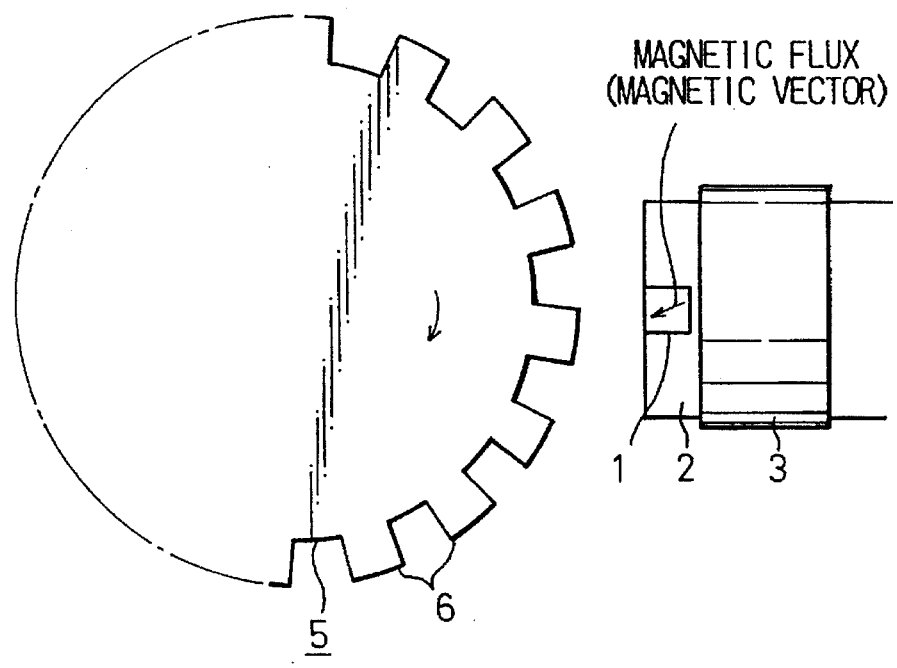
Figure 8:
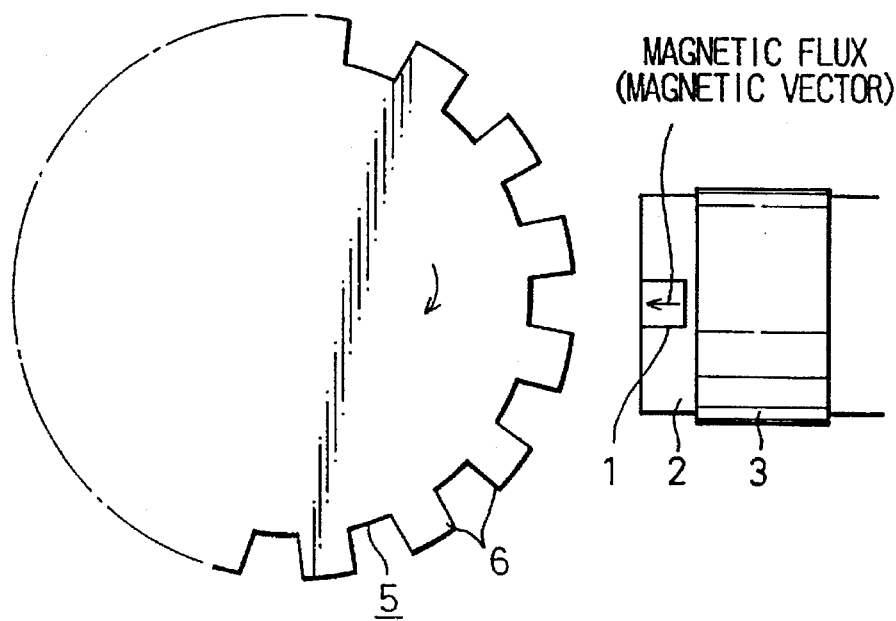
Figure 9:
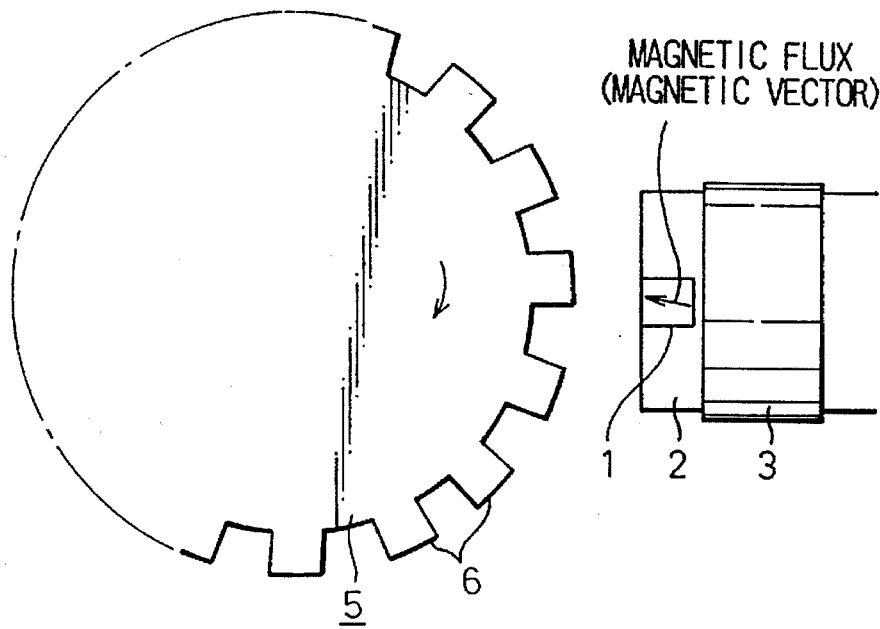

Referring to FIGS. 6, 7, 8, and 9, a tooth 6 of the rotating gear 5 draws and deflects a magnetic vector in a gap between the gear 5 and the magnet 3, in a magnetic circuit circulating through the gear 5, the MREs 7 and 8 and the magnet 3. This deflection of the magnetic vector causes a change in electric resistance of the MREs 7 and 8 disposed between the gear 5 and the magnet 3, in which the MREs 7 and 8 change in resistance in opposite directions. A processing circuit 25 (FIG. 4) provided in the same chip shapes the waveform of the resistance change and outputs pulses at a rate (corresponding to the number of teeth) proportional to the rotation speed of the gear 5, as shown in FIG. 5.

Figure 10:
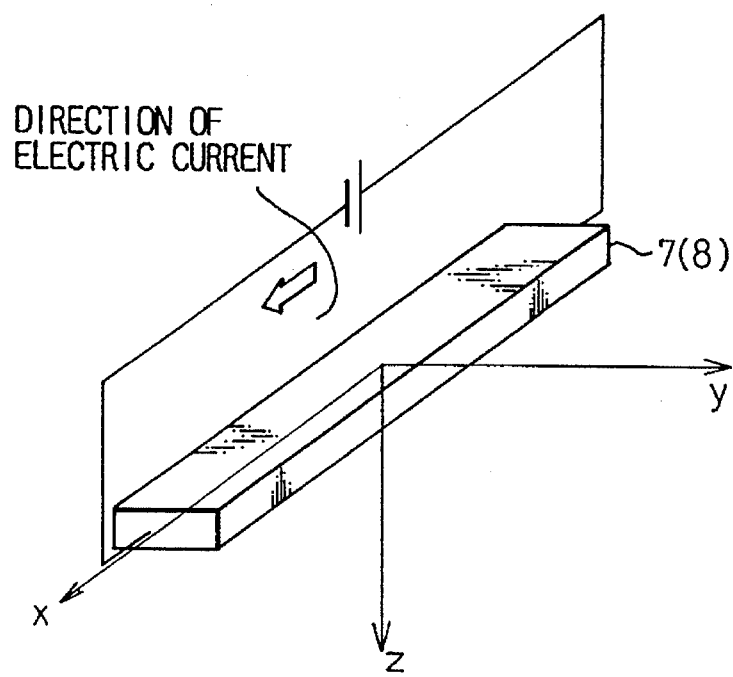
FIG. 10 shows the direction of a magnetoresistance effective element (MRE) in a perspective view.
Figure 11:
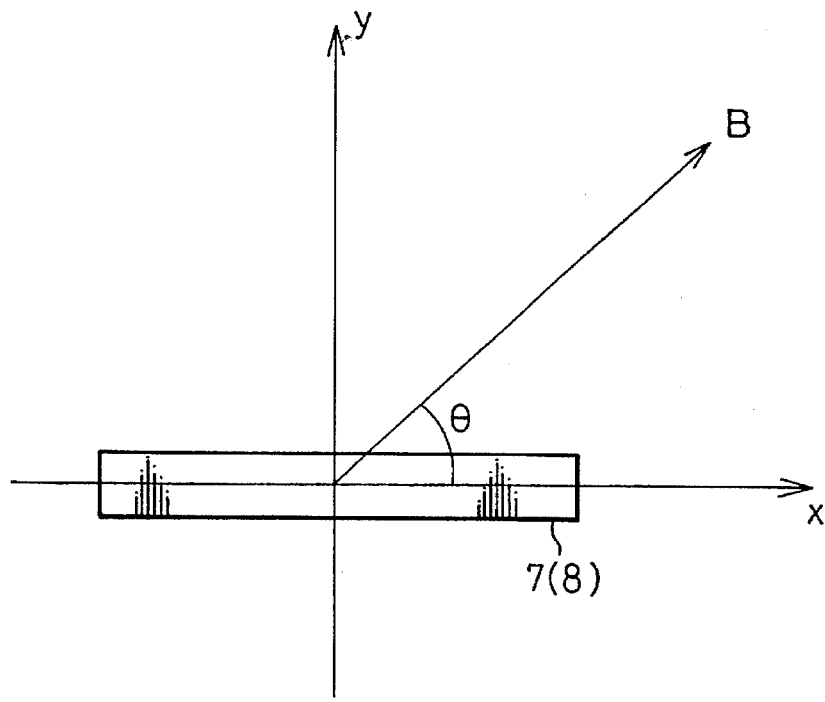
FIG. 11 shows the direction of an MRE in a top view.
Figure 12:
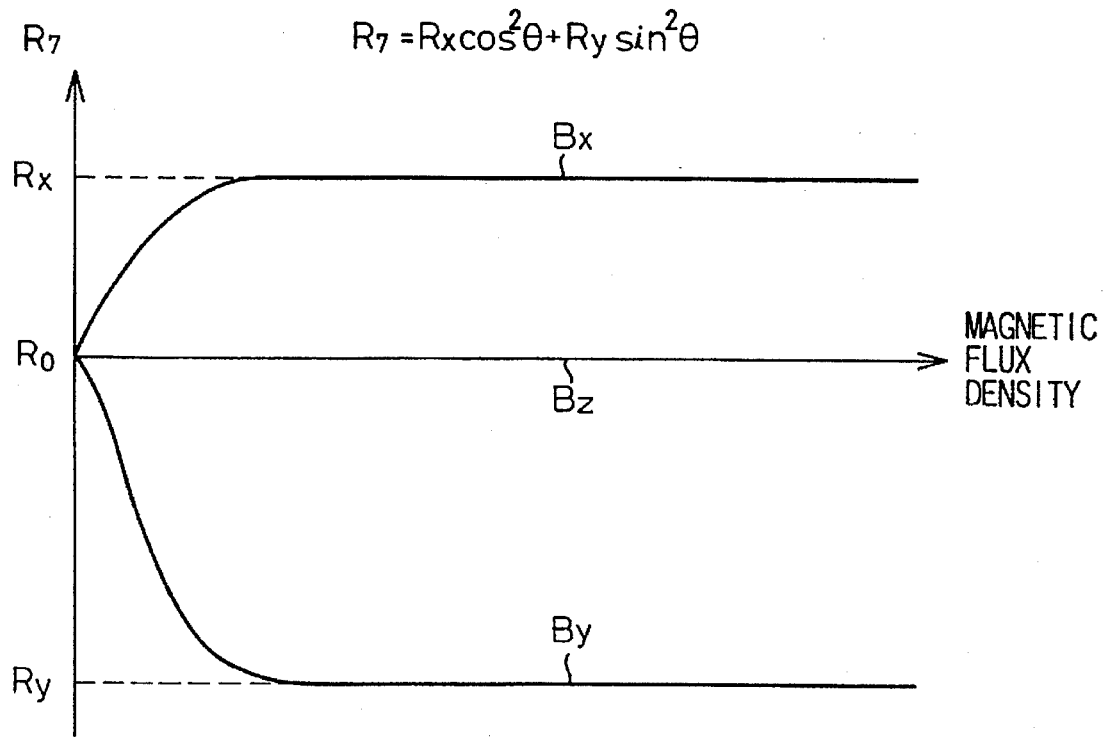
FIG. 12 is a graph showing the resistance of an MRE.
Figure 13:
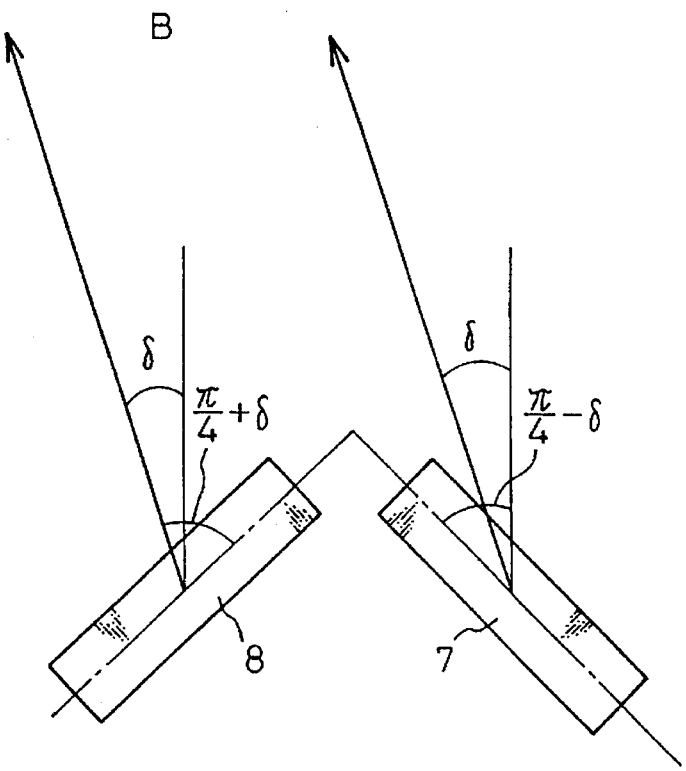
FIG. 13 shows the direction of a magnetic vector applied to a pair of MREs.

Referring to FIGS. 10, 11, and 12, the MREs 7 and 8 are subjected to a magnetic vector having direction components Bx and By. Bx and By are defined as magnetic vector components lying in parallel with and perpendicular to the electric current flowing through an MRE, respectively. The resistance of the MREs 7 and 8 are expressed by the following formulas, respectively, where Rx and Ry denote resistances in the saturation region and δ denotes the angle of deflection of the magnetic vector B.

$$R7 = R x \cos^2\{(\pi/4) - \delta\} + R y \sin^2\{(\pi/4) - \delta\}$$
$$= (Rx + Ry)/2 + (Rx - Ry)/2 \sin 2\delta$$
$$R8 = R x \cos^2\{(\pi/4) + \delta\} + R y \sin^2\{(\pi/4) + \delta\}$$
$$= (Rx + Ry)/2 - (Rx - Ry)/2 \sin 2\delta$$

Hence, difference $\Delta R$ between resistances R7 and R8 is expressed as:

$$\Delta R = R8 - R7$$
$$= (Rx - Ry)\sin 2\delta$$

A magnetic circuit designed so that the deflection angle $\delta$ of the magnetic vector B has a maximum value $\delta$ max within the range of from − about 45° to + about 45° would improve the sensitivity of the MREs 7 and 8 in terms of the rate of change in resistance, which is expressed by $\Delta R/R$ (R=R7=R8).

FIGS. 14 and 15 show the actual results thus obtained. The sensitivity of the MREs 7 and 8 is proportional to the distance from the MREs 7 or 8 to the magnet 3. To provide a maximum sensitivity when the distance from the gear 5 to the MREs 7 or 8 is constant, the MREs 7 and 8 had better be close to the magnet 3. It is believed that this condition provides a maximum value of the deflection angle $\delta$ of the magnetic vector B. To actually establish this condition, the biasing magnet 3 has a hollow structure in this example. Namely, the biasing magnet 3 has a hollow portion containing a molded IC including a sensing element so that the MREs 7 and 8 are close to the magnet 3.

Figure 16:
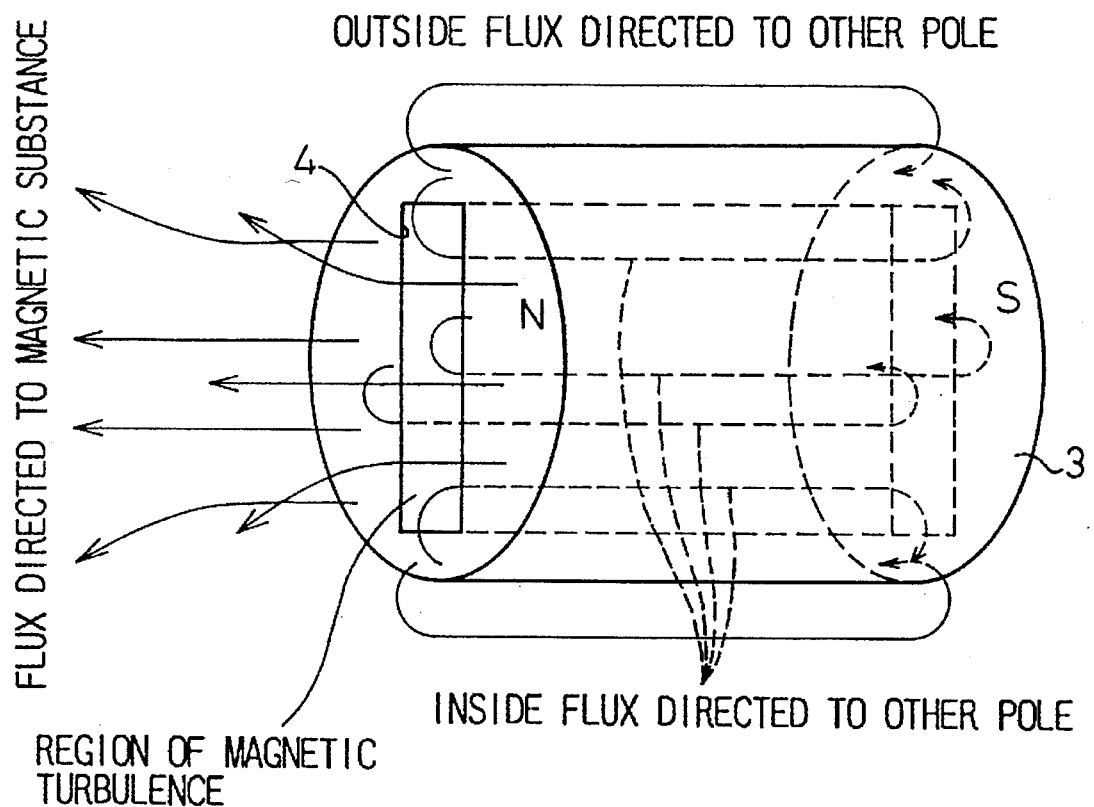
FIG. 16 shows a biasing magnet according to the present invention, in a perspective view.

FIG. 16 shows a magnetic turbulence region near the end of the magnet 3, in which region the magnetic vector is attracted toward the through hole or hollow portion 4 and deflected away from the magnetic circuit, and therefore, correct information of the rotation of the gear cannot be obtained. It is believed that the region of magnetic turbulence has a relationship with a surface magnetic field intensity of the magnet 3 and the shape of the hollow portion, and is actually generated in a range of from 0 to 1 mm from the magnet 3.

Therefore, in an optimum design of the magnetic circuit, the maximum sensitivity is obtained when the MREs 7 and 8 are located at no less than 1 mm from the magnet 3, because a distance less than 1 mm will put the MREs 7 and 8 into the region of magnetic turbulence.

The distance between the magnetoresistance effective element and the biasing magnet is defined as a distance from the magnet to the end of the magnetoresistance effective element which end is nearest to the magnet.

Thus, in this example, a biasing magnet 3 generates a bias magnetic field directed to an object of detection or gear 5 having a magnetic material; magnetoresistance effective elements (MREs) 7 and 8 are disposed at an inclination of about 45° to the direction of the bias magnetic field to provide a change in resistance caused by the bias magnetic field in accordance with movement of the object 5 of detection, so as to detect a change in the state of the bias magnetic field via the change in resistance of the MREs 7 and 8; and the biasing magnet 3 has a hollow portion 4 containing a holder or molding material 2 for holding the MREs 7 and 8 in a position between a surface of the biasing magnet 3 and the object 5 of detection and close to the surface of the biasing element 3.

This example according to the present invention minimizes the reduction in the sensitivity and prevents occurrence of the divided or doubled wave peaks of the output waveform of MREs by the feature that the MREs 7 and 8 are disposed at an inclination of about 45° to the direction of the bias magnetic field, in a position between a surface of the biasing magnet 3 and the object 5 of detection and close to the surface of the biasing element 3.

A maximum sensitivity is achieved when the distance from the MREs 7 or 8 to the biasing magnet 3 is 1 mm, i.e., a minimum value ensuring exclusion from the region of turbulence of magnetic vector due to the hollow structure of the magnet 3.

The biasing magnet may be a rare-earth magnet, which provides a strong magnetic field so as to ensure provision of a field intensity (or a sensor saturation field intensity) necessary for detecting rotation even when the sensing element is distant from the biasing magnet. Therefore, leads for the input terminal of the sensing element may extend around the biasing magnet. The rare-earth magnet, however, is expensive.

The magnet cost may be reduced by using a ferritic plastic magnet, which is less expensive but provides a weaker field intensity than that provided by a rare earth magnet, and therefore, a sensor having the same structure as that used with a rare earth magnet cannot provide the necessary saturation field intensity for a magnetoresistance effective element.

To eliminate this drawback, the present invention uses a biasing magnet having a hollow portion in which a molding material is inserted to reduce the distance from the MREs 7 or 8 to the magnet 3, thereby providing the necessary field intensity (or a sensor saturation field intensity) for the detection of rotation even when a ferritic plastic magnet having a weaker surface field is used. This reduces the cost of the biasing magnet.

The use of a plastic magnet is also advantageous because a hollow structure is easily obtained by a usual process for molding resin articles having a hollow structure.

Because the biasing magnet has a hollow portion in which a molding material is inserted, the lead for the inputs to the sensor (or the lead frames 22) need not extend around the magnet 3 and need not be folded, leading to easy assembly.

Although FIG. 4 shows magnetoresistance effective elements disposed at inclinations of plus and minus about 45° to the direction "W" of the magnetic field of the biasing magnet, the inclinations are not limited to 45° for the following reasons.

The present invention adopts a concept similar to that disclosed in Japanese Unexamined Patent Publication (Kokai) No. 3-195970 (U.S. Pat. No. 5,134,371) and detects the magnetic vector varying within a plane parallel to the plane on which a magnetoresistance effective element is formed, in order to prevent the division of a single wave peak into double wave peaks which would otherwise occur when the detected signal (waveform) obtained by the resistance change is converted by the processing circuit 25 into binary signals if an air gap is present between an object of detection and a magnetoresistance element.

Therefore, when the magnetic field is deflected toward MREs 7 and 8 about the direction "W", the MREs are not necessarily be inclined at 45° but may be disposed at different angles to the magnetic vector varying in accordance with the movement of the object of detection. As suggested by U.S. Pat. No. 5,134,371, however, when the magnetic field is deflected about the direction "W", the inclination angle is most preferably 45° (or 135°) to provide the greatest resistance change of MREs. This inclination angle is also advantageous because the MREs define an angle of 90° therebetween and have antiphase resistance changes to provide the greatest output voltage.

For example, the MREs 7 and 8 may be disposed respectively at an inclination angle of 60° or 135°, or at different angles to the direction "W".

Namely, in the magnetic detection device according to the present invention, MREs are formed and disposed in a plane parallel to the plane defined by the direction of movement of the object of detection and the direction of the bias magnetic field generated by the biasing magnet toward the object of detection, in which the magnetizing surface of the biasing magnet is located close to the MREs to improve the sensitivity of the MREs. In Example 1, the biasing magnet has a hollow structure to ensure that the magnetizing surface and the MREs are closely located. The same condition is ensured in every one of the examples disclosed herein.

EXAMPLE 2

Another example is described, particularly the differences from Example 1.

Figure 17:
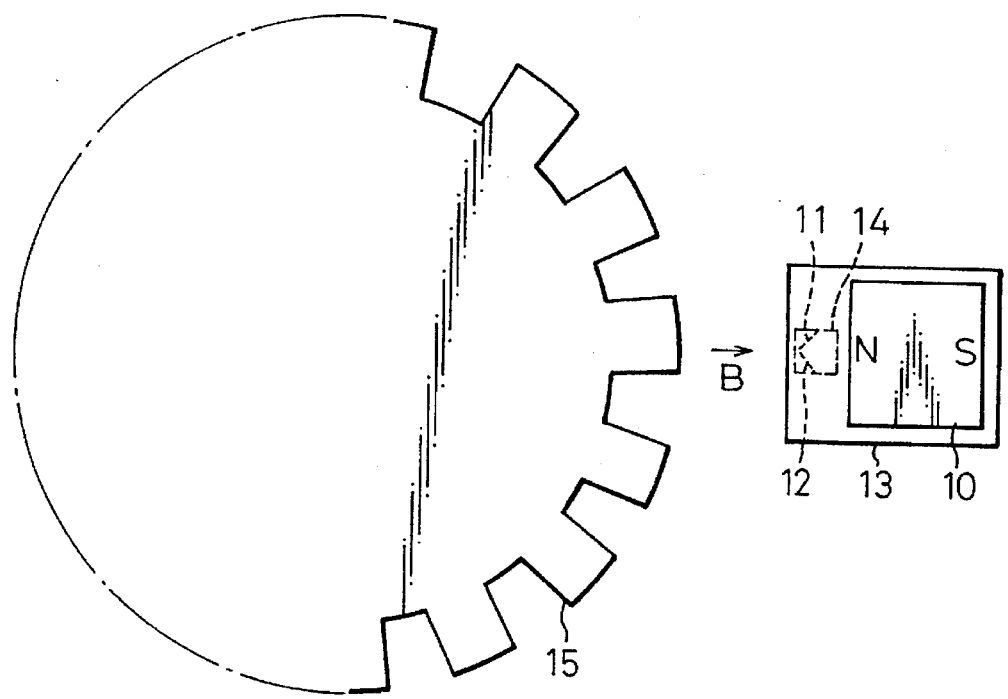
FIG. 17 shows a preferred arrangement of a magnetic rotation detection device of Example 2 according to the present invention, in a front view.
Figure 18:
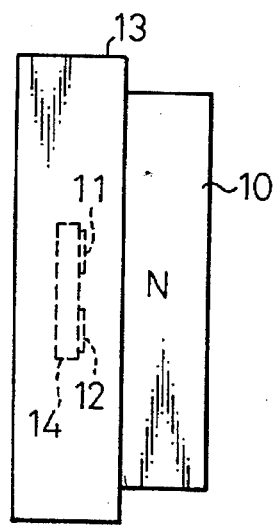
FIG. 18 shows the device of FIG. 17 in a side view in the direction of the arrow B of FIG. 17.

FIGS. 17 and 18 schematically illustrate an embodiment of a magnetic rotation detection device according to the present invention. FIG. 17 is a front view and FIG. 18 is a side view of the same viewed in the direction of the arrow B.

In this example, a molding material 13 for holding MREs 11 and 12 is mounted on a side surface of a biasing magnet 10, in which the MREs 11 and 12 are disposed close to a surface of the biasing magnet 10 in a plane parallel to a plane defined by a direction of movement of the object of detection.

The biasing magnet 10 is in a plate form. A sensing element 14 having the MREs 11 and 12 is molded in the molding material 13. The biasing magnet 10 and the molding material are bonded with an adhesive. The MREs 11 and 12 are located closer to a gear 15 than the biasing magnet 10.

The positioning of the MREs 11 and 12 and the manner of magnetic detection are the same as in Example 1.

Thus, in this example, a biasing magnet 10 generates a bias magnetic field directed to an object of detection or gear 15 having a magnetic material; magnetoresistance effective elements (MREs) 11 and 12 are disposed at an inclination of about 45° to the direction of the bias magnetic field to provide a change in resistance caused by a change in the bias magnetic field in accordance with movement of the object 15 of detection, so as to detect a change in the state of the bias magnetic field via the change in resistance of the MREs 11 and 12; and the biasing magnet 10 has a side surface on which mounted is a holder or molding material 13 for holding the MREs 11 and 12 in a position close to a surface of the biasing element.

This example according to the present invention disposes the MREs 11 and 12 close to the biasing magnet 10, thereby ensuring provision of the necessary field intensity (or a sensor saturation field intensity) for detecting rotation even when a ferritic plastic magnet having a weak surface field intensity is used as the biasing magnet.

Figure 19:
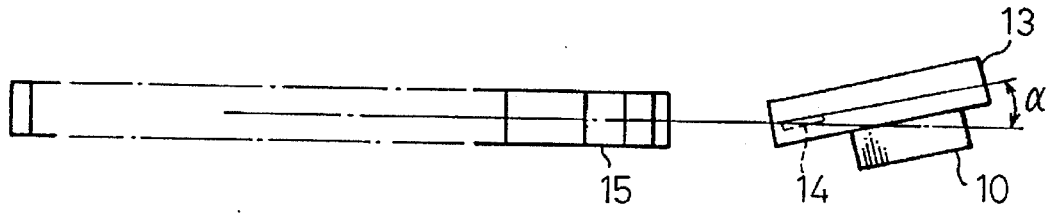
FIG. 19 shows a modification of the device of Example 2, in a plan view.

This example may be modified in a manner such as shown in FIG. 19, in which the molding material 13 and the sensing element 14 are advantageously disposed at an inclination of angle α to the center line of the gear 15.

EXAMPLE 3

A further embodiment will be described, particularly the differences from Example 1.

Figure 20:
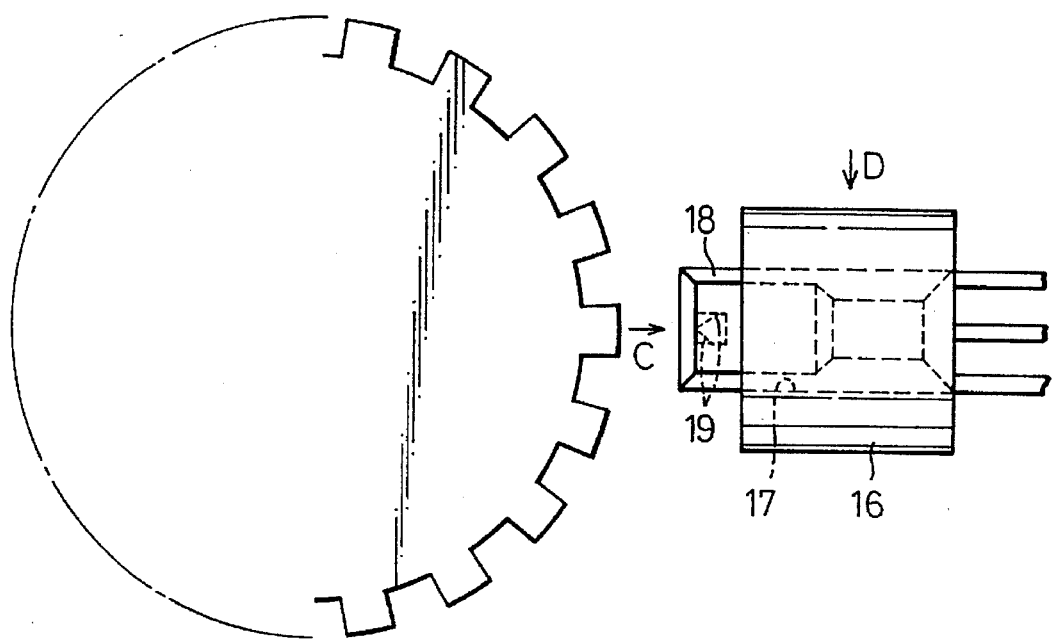
FIG. 20 shows a preferred arrangement of a magnetic rotation detection device of Example 3 according to the present invention, in a front view.
Figure 21:
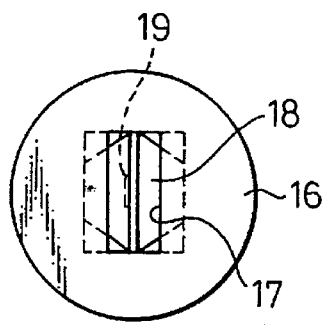
FIG. 21 shows the device of FIG. 20 in a side view in the direction of the arrow C of FIG. 20.
Figure 22:
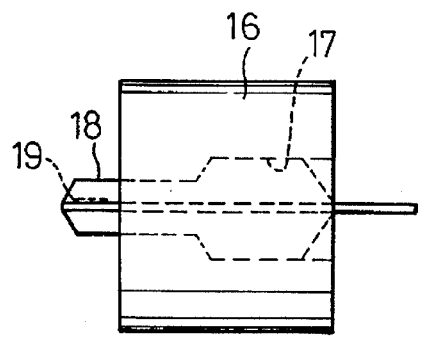
FIG. 22 shows the device of FIG. 20 in a plan view in the direction of the arrow D of FIG. 20.

FIGS. 20, 21, and 22 show a general arrangement of a magnetic rotation detection device according to the present invention, in a front view, a side view along the arrow C of FIG. 20, and a top view along the arrow D of FIG. 20.

In this example, a biasing magnet 16 has a through hole 17 and a molding material 18 is inserted in the through hole 17. The molding material and the through hole 17 have tapered steps to fix the MREs 19 in a position protruding from the magnetizing surface of the biasing magnet 16. Namely, this example uses the steps to fix the position of the MREs 19 whereas, in Example 1, the molding material 2 is inserted in the through hole 4 and is bonded to the through hole 4 in a predetermined position.

Figure 23:
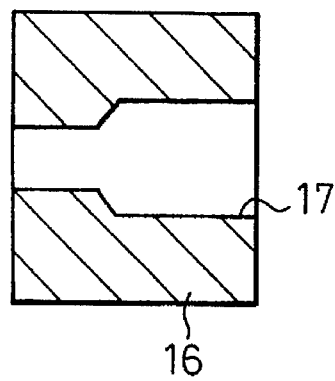
FIG. 23 shows a biasing magnet according to the present invention, in a longitudinal vertical sectional view.
Figure 24:
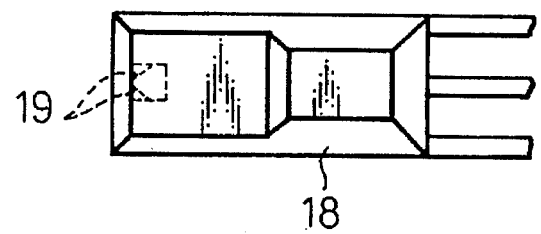
FIG. 24 shows a molding material according to the present invention, in a plan view.
Figure 25:
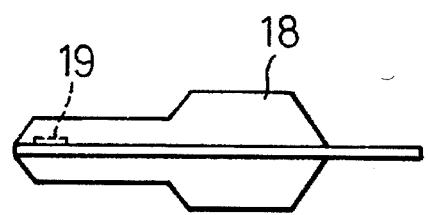
FIG. 25 shows the molding material of FIG. 24, in a front view.

FIG. 23 shows a cross section of the biasing magnet 16 and FIGS. 24 and 25 show the molding material in plan and side views, respectively. As shown in FIG. 23, the biasing magnet 16 has a through hole 17 having a thin head and a thick tail, with an intervening step therebetween. As shown in FIGS. 24 and 25, the molding material 18 has a thin head and a thick tail, with an intervening step therebetween. The molding material 18 is inserted in the through hole 17 of the biasing magnet 16 and fixed in a position where the step of the through hole 17 of the biasing magnet 16 and the step of the molding material are abut.

Thus, this example provides the through hole 17 and the molding material 18 with steps, respectively, so that the MREs 19 are fixed at the position protruded from the magnetizing surface of the biasing magnet 16. Thus, the mutual positioning between the sensing element (MREs 19) and the biasing element 16 can be easily controlled by merely inserting the molding material 18 in the through hole 17. The molding material 18 and the biasing magnet 16 are both manufactured by die forming process, so that the mutual positioning between the sensing element (MREs 19) and the biasing magnet is readily controlled or stably determined.

EXAMPLE 4

A further example will be described, particularly for the difference from Example 1.

FIG. 26 shows a general arrangement of a magnetic rotation detection device according to the present invention. In this example, a molding material 20 is inserted in a through hole 23 of a biasing magnet 21, positioned, and then cut at the tip portion to remove a thickness "t".

Figure 27:
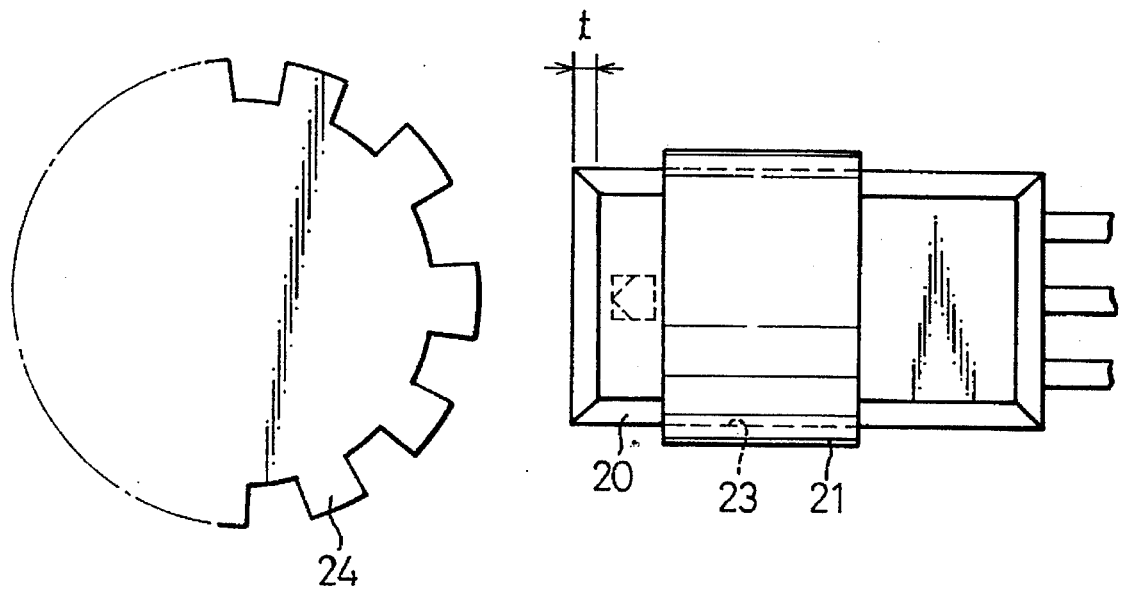
FIG. 27 shows the device of FIG. 26 before the tip portion is cut off, in a front view.

Namely, the molding material 20 is inserted in the through hole 23 as shown in FIG. 27, and then, cut at the tip portion to remove a thickness "t" to provide the form shown in FIG. 26. This enables an air gap between the molding material 20 and the gear 24 to be enlarged by a distance of "t" while the sensor performance is kept on the same level as that of the conventional device. This is advantageously used in a magnetic circuit of a rotation detection device whose performance varies when the air gap varies by a distance as small as 0.1 mm.

The rotation detection devices which are currently commercially available include those using a magnetic circuit composed of a rotating body, a sensing element and a biasing magnet, in which the air gap between the rotating body and the device is 1.2 mm at most. To mount a rotation detection device with the air gap set at 1 mm or less, the precision of the parts composing the rotating body and the precision of the mutual positioning of the rotating body and the device are required. Recently, to mitigate this requirement, a rotation detection device allowing a greater air gap is desired. However, a mold resin for molding a sensing element has a length which requires a gap upon mounting of the detection device, so that a sufficient air gap (1 mm) cannot be obtained.

In this example, the molding material 20 is assembled with the biasing magnet 21, and then, is cut in the tip portion to provide an enlarge air gap.

As described above, the present invention minimizes the reduction in the sensitivity of the magnetoresistance effective element while preventing occurrence of the divided or doubled wave peaks.

EXAMPLE 5

This example provides a preferred embodiment of the present invention advantageously solving the following conventional problem, in particular.

Figure 28:
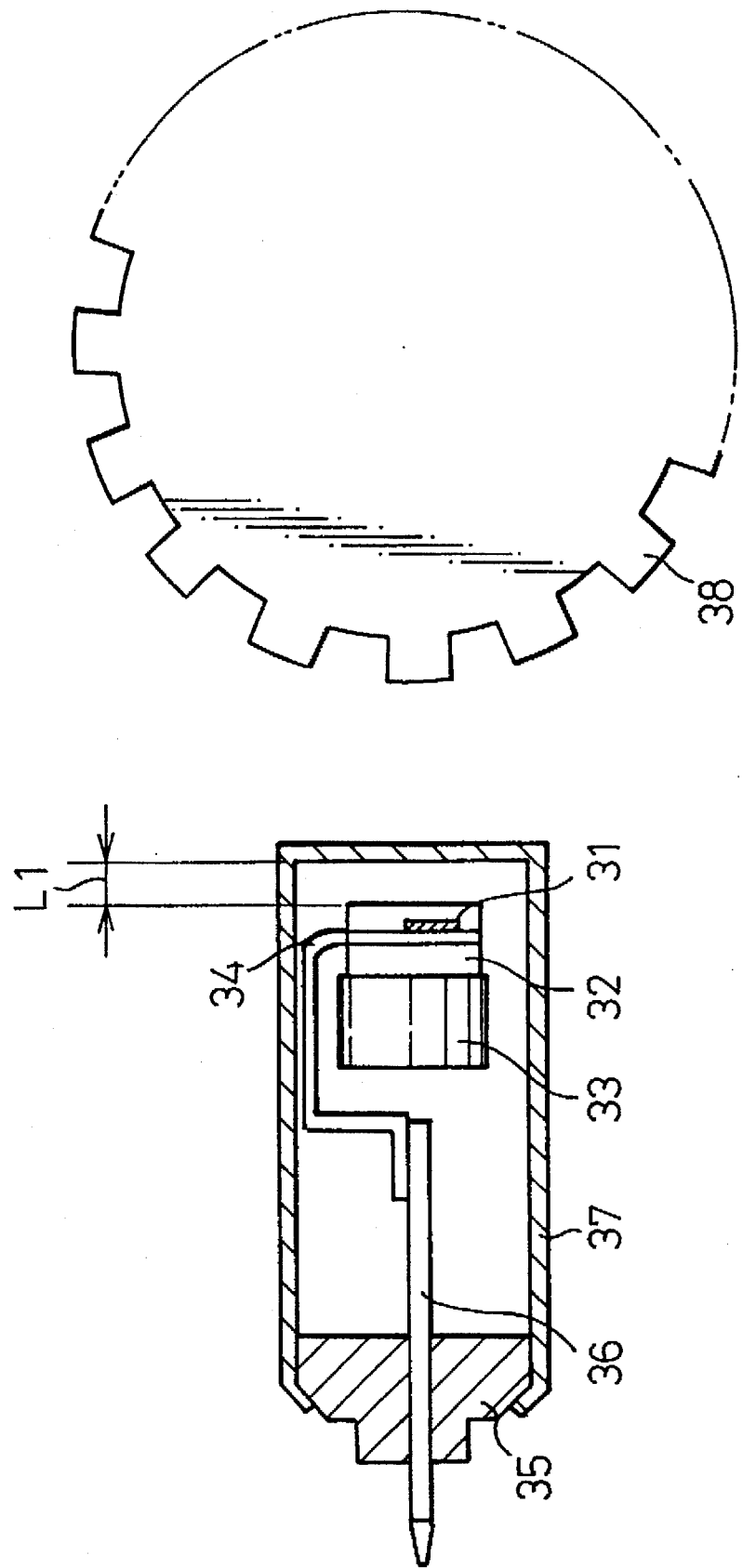
FIG. 28 shows a space or distance between the molding material containing MREs and the cap of the conventional magnetic detection device, in a sectional view.

As shown in FIG. 28, a prior art magnetic rotation detection device is fabricated by molding an MRE 31 in a resin molding material, bonding the molding material 32 to a biasing magnet 33, bonding a lead frame 34 extending from the molding material 32 to a terminal 36 extending from a terminal holder, and enclosing these members in a cap 37.

However, there is a problem that it is difficult to bond the lead frame 34 and the terminal 36 while maintaining the distance L1 between the molding material and the inner surface of the cap 37, so that it is also difficult to control the air gap between the MRE 31 and an object of detection.

To solve this problem, a magnetic detection device of this example comprises: a biasing magnet for generating a bias magnetic field directed to an object of detection; a holder for holding a magnetoresistance effective element which detects a change in the bias magnetic field in response to a movement of the object of detection in terms of a change in electrical resistance of the element; and the holder being pressed against a rear surface of a non-magnetic cap facing the object of detection.

The biasing magnet has a through hole through which the holder is pressed against the rear surface of the non-magnetic cap closing one end of the through hole.

Figure 29:
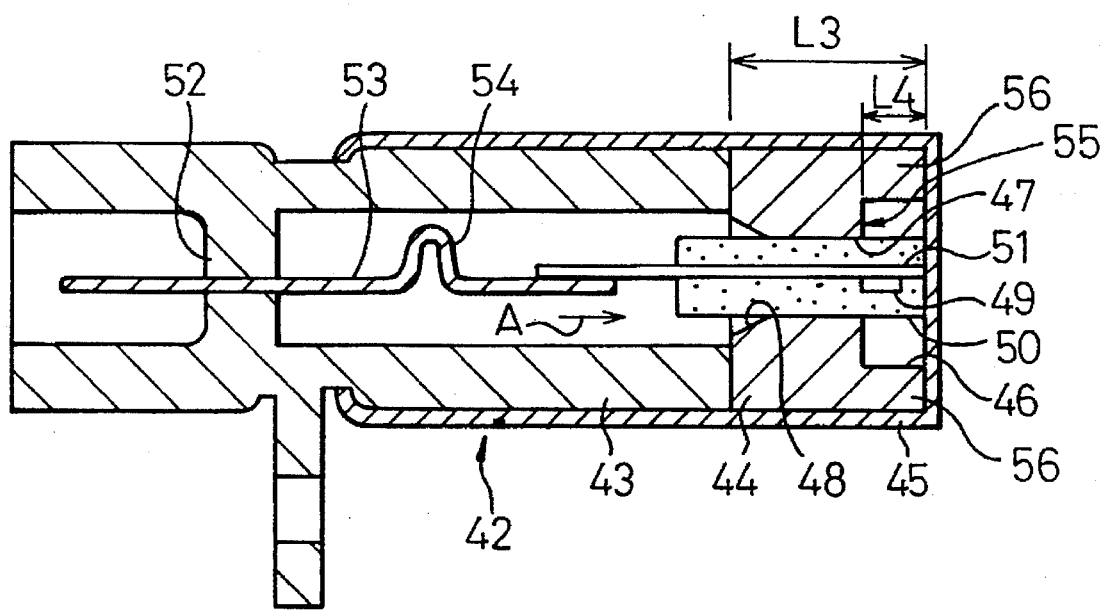
FIG. 29 shows a magnetic rotation detection device of Example 5 according to the present invention, in a sectional view.

FIG. 29 shows a magnetic rotation-detection device 42 provided with a round columnar resin housing 43, a round columnar permanent magnet 44 disposed on the tip (right end) of the resin housing 43. The magnet generates a bias magnetic field directed to an object of detection. A round columnar cap 45 closed on one end and bonded by staking to the housing 43 encloses the permanent magnet 44 and the front half of the housing 43. The cap 45 is 0.25 mm thick and made of JIS SUS 304 stainless steel, which is non-magnetic. The cap 45 forces the housing 43 and the permanent magnet 44 to abut each other at the right end of the housing 43.

The permanent magnet 44 has a cavity 46 on the tip or right end and a through hole 47 extending along the center axis of the magnet 44. The through hole 47 communicates with the cavity 46 on the right end and has an outward-broadening tapered opening 48 on the left end.

An MRE 49 in the form of a chip molded in a molding material 50 of an epoxy resin is inserted in the through hole 47 of the permanent magnet 44. More specifically, the MRE chip 49 is mounted on a copper lead frame 51 and molded in the molding material 50 together with a portion of the lead frame 51 in a manner such that the MRE 49 is located in the cavity 46 of the permanent magnet 44 and the lead frame 51 extends through the through hole 47 and protrudes from the left end of the molding material 50.

The round columnar housing 43 has a partition 52 dividing the inside space thereof to right and left portions. Terminals 53 for external connection contained in the housing extend through and are held by the partition 52. The terminals 53 include those for output, ground (GND), power input, etc. The terminals 53 are welded at the right end to the left end of the lead frame 51. The terminals 53 have a U-shaped fold 54 at a longitudinal intermediate position as a resilient portion to push rightward (arrow A of FIG. 29) the molding material 10 via the lead frame 51.

The device 42 is fabricated in the following process sequence.

Figure 30:
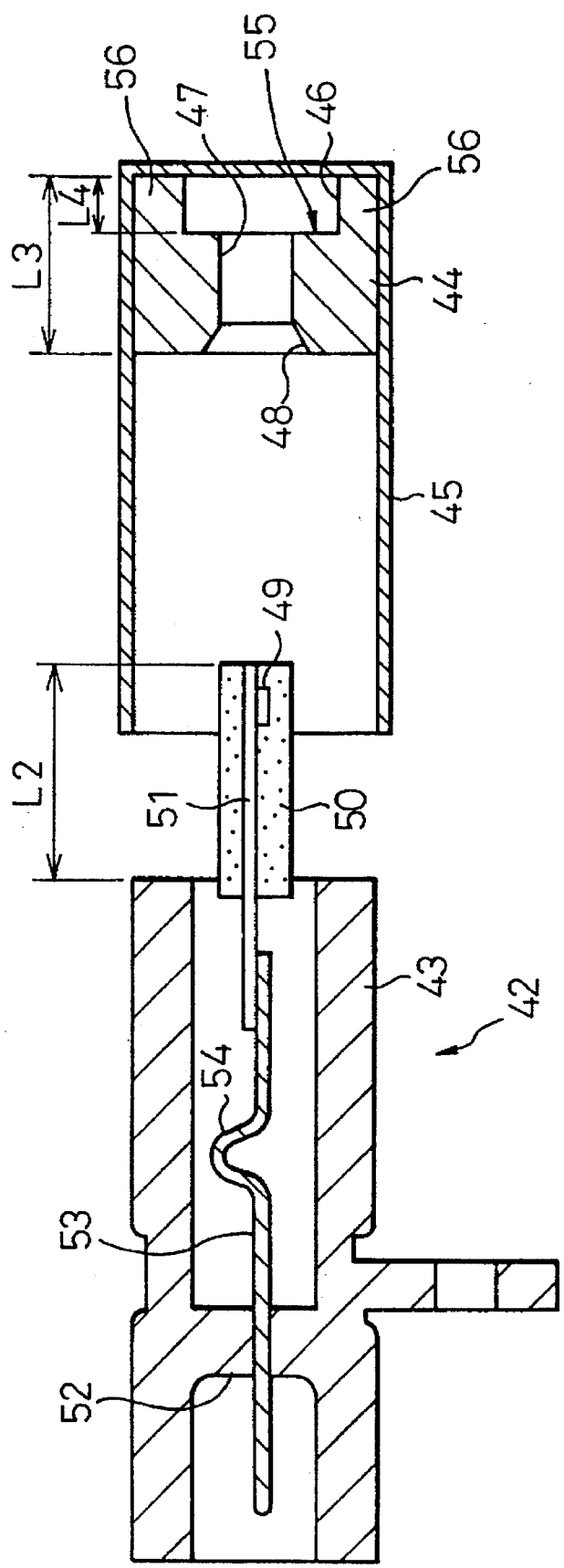
FIG. 30 shows the device of FIG. 29 in the process stage before capping, in a sectional view.

Referring to FIG. 30, a housing 43 having terminals 53 inserted therein is first prepared. A molded IC in which an MRE 49 and a lead frame 51 are molded with a molding material 50 is also prepared. A cap 45 with one end closed and including a permanent magnet 44 is prepared.

The lead frame 51 is bonded on one end to the tip of the terminals 53 by soldering, welding or other suitable bonding methods. The distance L2 between ends of the housing 43 and the molded IC 50 is greater than the length L3 of the permanent magnet 44.

The housing 43 with the molded IC (molding material 50) is fittingly inserted into the cap 45 through the open end of the latter until the molded IC 50 engages with the through hole 47 by being guided by the tapered opening 48 of the through hole 47 so that the leading end of the molded IC (molding material 50) abuts the inner surface of the closed end of the cap 45. The housing 43 is further inserted into the through hole 47 until the right end of the housing 43 abuts the left end of the permanent magnet 44 while the leading end of the molded IC (molding material 50) is pressed against the inner surface of the closed end of the cap 45 by a pressure from the compressed resilient fold 54 of the terminals 53. The cap 45 is then fixed to the housing 43 by staking the open end of the cap 45 to complete the magnetic detection device shown in FIG. 29.

The contact between the molded IC (molding material 50) and the cap 45 is always maintained by the pressure from the resilient fold 54.

The cavity 46 shown in FIGS. 29, 30, and 32 has a function as follows. As described with reference to FIGS. 14, 15, and 16, the MRE 49 must be kept apart from an end surface 55 of the through hole 47 of the magnet 44 at a protrusion distance, for example, of 1 mm, in order to avoid undesirable influence of the magnetic turbulence because of the hollow structure of the magnet 44. The protrusion distance must be constant between the manufactured devices in order to provide a stable sensitivity of the device. This is advantageously ensured because the protrusion distance is stably obtained by a constant distance L4 defined by the side wall of the cavity 46, which protrudes at a constant height in the same direction of the protrusion of the MRE 49, and the cap 45. Thus, the mass-produced devices have a stable detection performance. The position of the cavity 46 should be carefully designed taking the magnetic turbulence into consideration.

The cavity 46 has another function that any unavoidable external feromagnetic powders, such as iron powder, are gathered onto the outer surface of the cap 45 facing a not-shown gear, in the portion over the extended peripheral portion 56 of the magnet 44 surrounding or defining the cavity 46 because the magnetic field is strongest in this portion of the outer surface of the cap 45.

If the cavity 46 is not provided, iron and other feromagnetic powders are gathered and adhered to the outer surface of the cap 45 facing a gear in the portion over the central portion of the magnet 44 near the MRE 49 and the thus-gathered iron powder concentrates the magnetic field thereto and reduces the change in magnetic field which would otherwise occur in accordance with the rotation of the gear, with the result that good detection of the gear rotation cannot be achieved.

The provision of the cavity 46 is advantageous because iron powder is gathered onto the peripheral portion of the outer surface of the cap 45 and the undesirable influence of the iron powder on the magnetic field is avoided to ensure good detection of the gear rotation.

Figure 32:
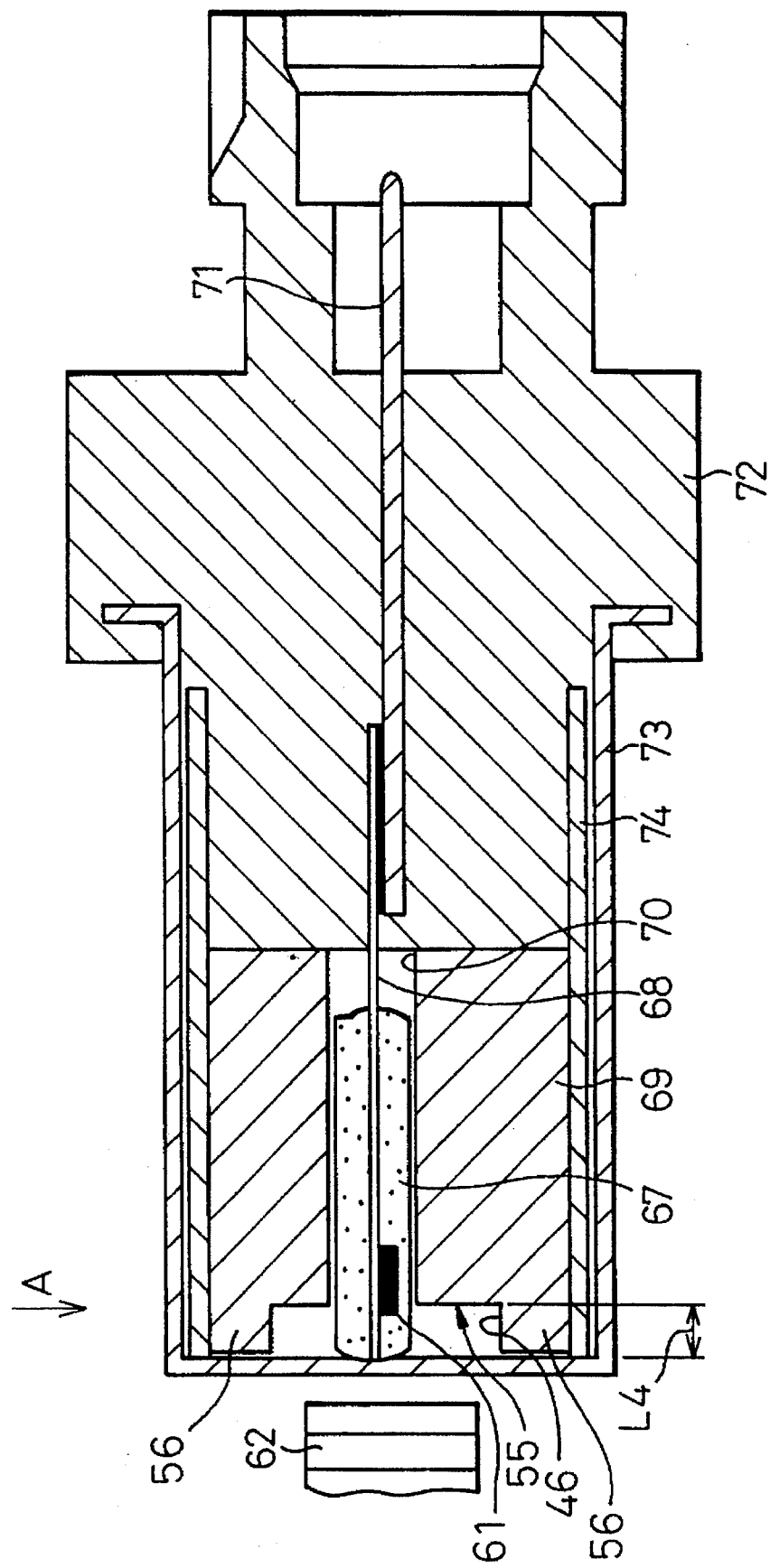
FIG. 32 shows a magnetic rotation detection device of Example 6 according to the present invention, in a sectional view.

The extended peripheral portion 56 of the magnet 44 is not necessarily a continuous ring as shown in FIGS. 29, 30, and 32, but may be composed of discrete segments surrounding and defining the cavity 46.

Figure 31:
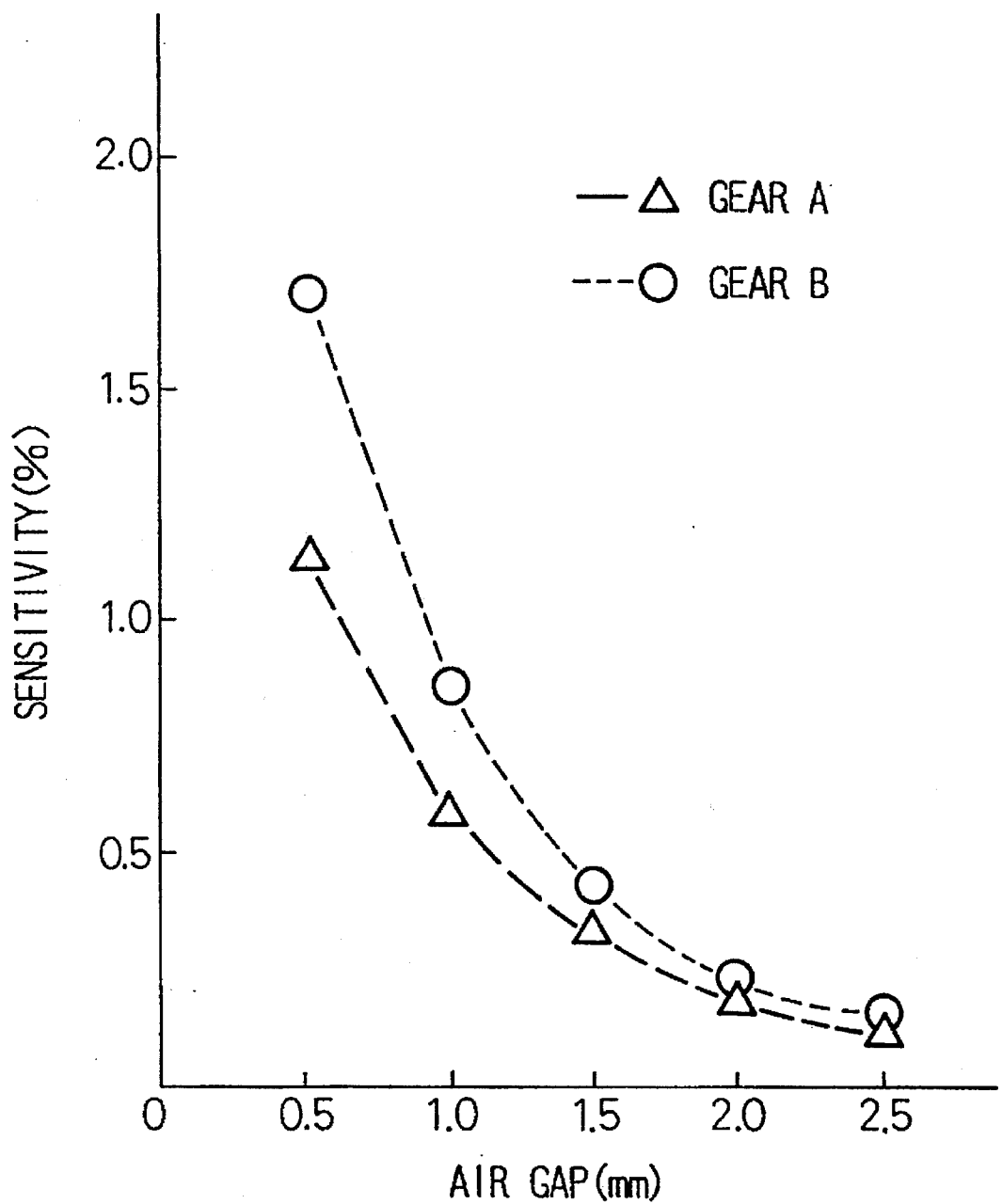
FIG. 31 is a graph showing the sensitivity of an MRE as a faction of the air gap between the MRE and a gear subjected to the magnetic detection.

FIG. 31 shows the sensitivity of the MRE 49 as a function of the air gap between the MRE 49 and a gear subjected to the magnetic detection. It can be seen from FIG. 31 that the sensitivity significantly depends on the air gap and that the smaller the air gap, the better the detection performance. This demonstrates that control of the air gap between the MRE 49 and the object of detection is very critical to the sensitivity of the magnetic detection device.

In this example according to the present invention, the molded IC (molding material 50) is always kept in contact with the cap 45 by a pressure from the resilient fold 54, so that the air gap between the MRE 49 and an object of detection can be kept, stably, at a small value. The prior art device shown in FIG. 28 has a space or distance L1, not zero, between the closed end of the cap 37 and the molding material 32 containing the MRE 31. This distance L1 is reduced to zero in this example of the present invention, and therefore, the air gap between an MRE and an object of detection can be also reduced to a desirable small value.

A fold may be formed in the lead frame 51 instead of the terminal 53.

EXAMPLE 6

This example provides a preferred embodiment of the present invention for advantageously avoiding the influence of a disturbing magnetic field.

FIG. 32 shows a magnetic rotation detection device according to the present invention, together with a gear 62 as an object of detection disposed close to a sensing element 61 of this device.

Figure 33:
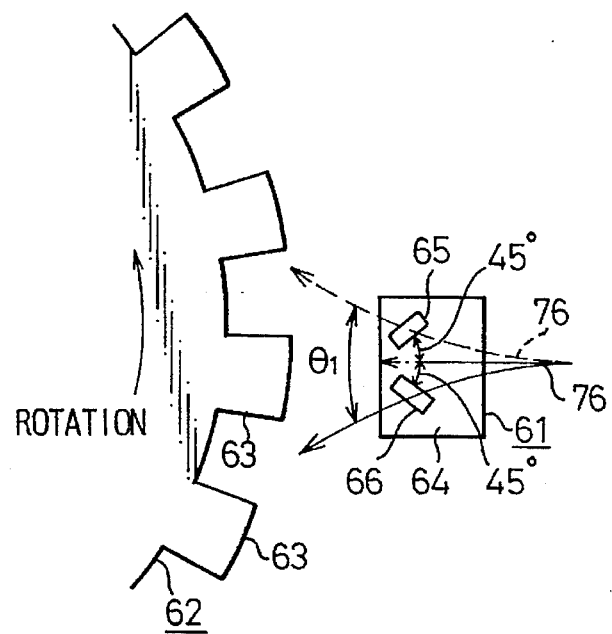
FIG. 33 shows the device of FIG. 32 viewed in the direction of the arrow A of FIG. 32.

FIG. 33 shows the sensing element 61 and the gear 62 of FIG. 32 seen in the direction of the arrow A. The gear 62 is made of a magnetic material and has numerous gear teeth 63. The sensing element 61 is composed of a chip 64 containing a pair of MREs 65 and 66 and faces the gear teeth 63 of the gear 62.

Referring to FIG. 32, the sensing element 61 is molded in a molding material 67. The sensing element 61 is located in the tip portion of the molding material 67. A lead frame 68 is also molded in the molding material 67 and protrudes from the right end of the molding material 67. In this example, the molding material is made of an epoxy resin.

A round columnar biasing permanent magnet 69 has a through hole 70 extending along the center axis of the magnet 69, in which through hole 70 the molded IC is inserted. In this example, the biasing magnet 69 is a ferritic plastic magnet.

The molding material 67 is fittingly inserted and fixed in a predetermined position in the through hole 70 of the biasing magnet 69. The molding material 67 is bonded to the magnet 69 by an adhesive. The biasing magnet 69 applies a bias magnetic field to the MREs 5 and 6.

In FIG. 33, the MREs 65 and 66 are disposed in the chip in a plane containing the direction of the bias field from the magnet 69 and at respective inclinations of plus and minus about 45° to the direction of the bias field.

In FIG. 32, the lead frame 68 has a right portion exposed from the molding material 67 and welded to a terminal 71 for external input and output. The lead frame 68 and the exposed portion of the terminal 71 are embedded in a housing 72 formed from a resin.

The left half of the housing 72 and the biasing magnet 69 are enclosed in a round hollow columnar electromagnetic wave shield case 73 closed on one end facing toward the gear 62. The electromagnetic wave shield case 73 is made of a non-magnetic metal such as JIS SUS 304 stainless steel and shields and protects the MREs 65 and 66 against an external or disturbance magnetic field.

The electromagnetic wave shield case 73 fittingly accommodates a round hollow columnar magnetic shield case 74 with both ends open. The magnetic shield case 74 covers the MREs 65 and 66 (FIG. 36) and has an open end facing toward the gear 62 (FIG. 32). The magnetic shield case 74 is made of a magnetic material such as Fe or Ni to magnetically shield the MREs 65 and 66.

The magnetic rotation-detection device operates in the following manner.

Figure 34:
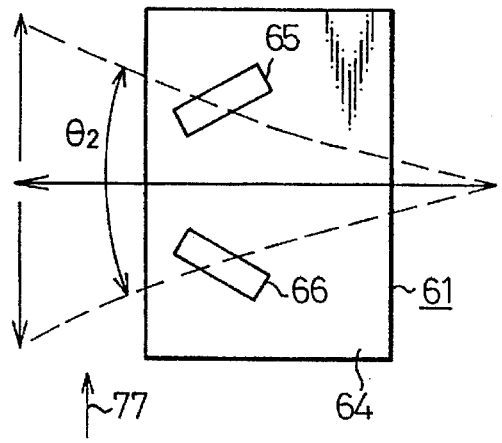
FIG. 34 shows the device of FIG. 33 subjected to a disturbance magnetic field.
Figure 35:
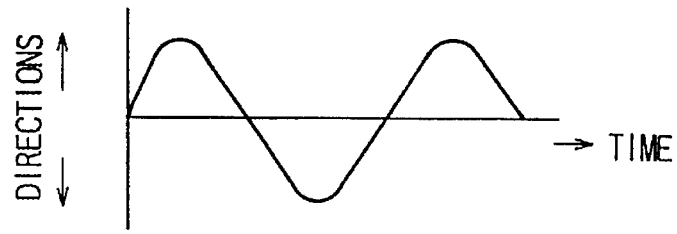
FIG. 35 shows an influence of the disturbance magnetic field.
Figure 36:
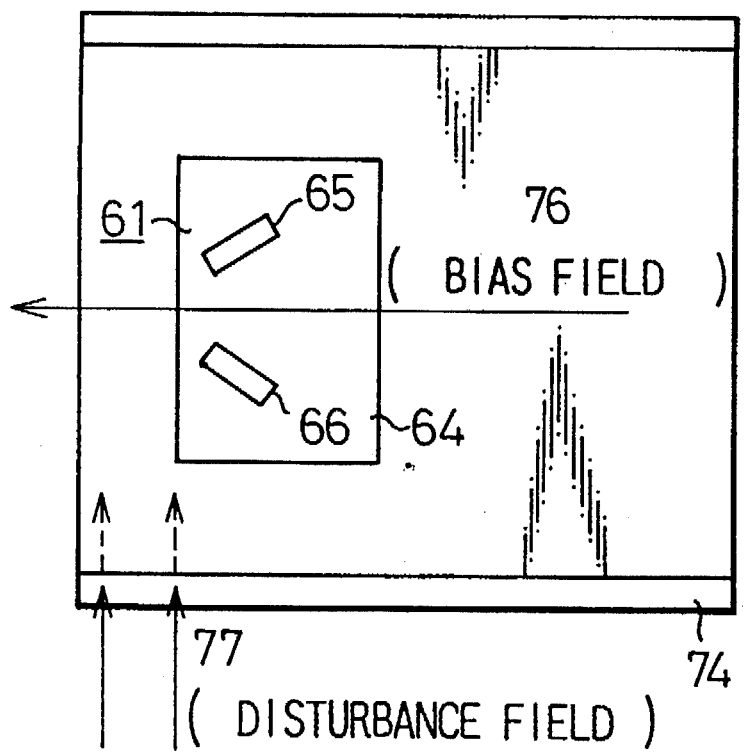
FIG. 36 shows a magnetic shield case according to the present invention.

Referring to FIG. 33, the bias field 76 generated by the biasing magnet 69 deflects through an angle θ1 as the gear or object of detection 62 rotates. The MREs 65 and 66 detect this deflection of the bias magnetic field. Suppose that an external or disturbance magnetic field 77 is present, other than the bias field 76, as shown in FIGS. 34 and 36. A dynamic disturbance field 77 whose intensity varies as time passes then generates a combined magnetic vector that causes the bias field to deflect through an angle θ2 as shown in FIGS. 34 and 35 even when the gear 62 does not rotate, leading to malfunctioning of the magnetic detection device.

To solve this problem, this example uses the magnetic shield case 74 as shown in FIG. 36 to prevent any external or disturbance field 77 from affecting the bias field 76, thereby preventing occurrence of improper deflection of the bias field 76.

The electromagnetic wave shield case 73 must entirely cover the MREs 5 and 6 and must be made of a non-magnetic metal such as JIS SUS 304 stainless steel in order not to stop but to allow the bias field 76 to pass therethrough toward an outside object of detection. In contrast, the magnetic shield case 74 must be made of a magnetic material such as Fe or Ni in order to shield against external magnetic fields.

EXAMPLE 7

A further embodiment of the present invention will be described.

Figure 43:
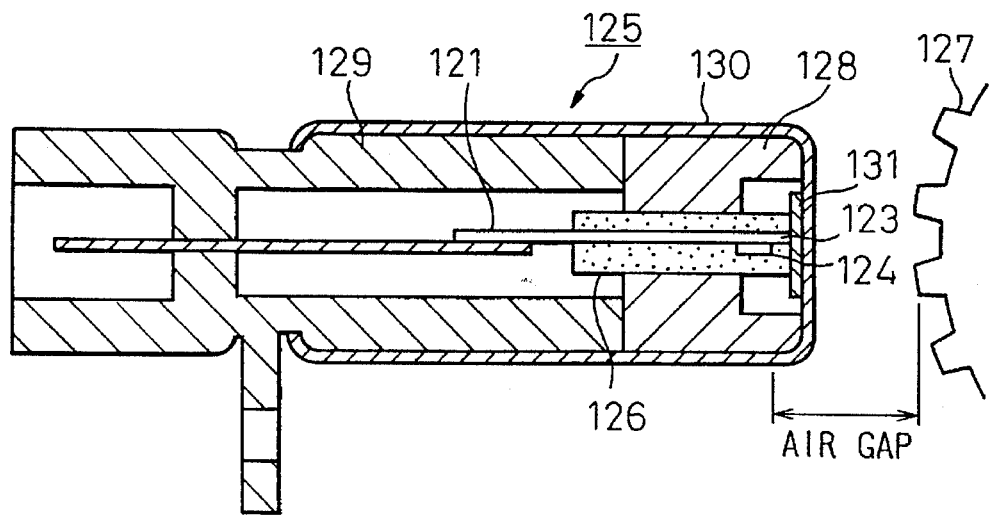
FIG. 43 is a cross-sectional view showing the construction of a magnetic detection device according to the prior art.
Figure 44:
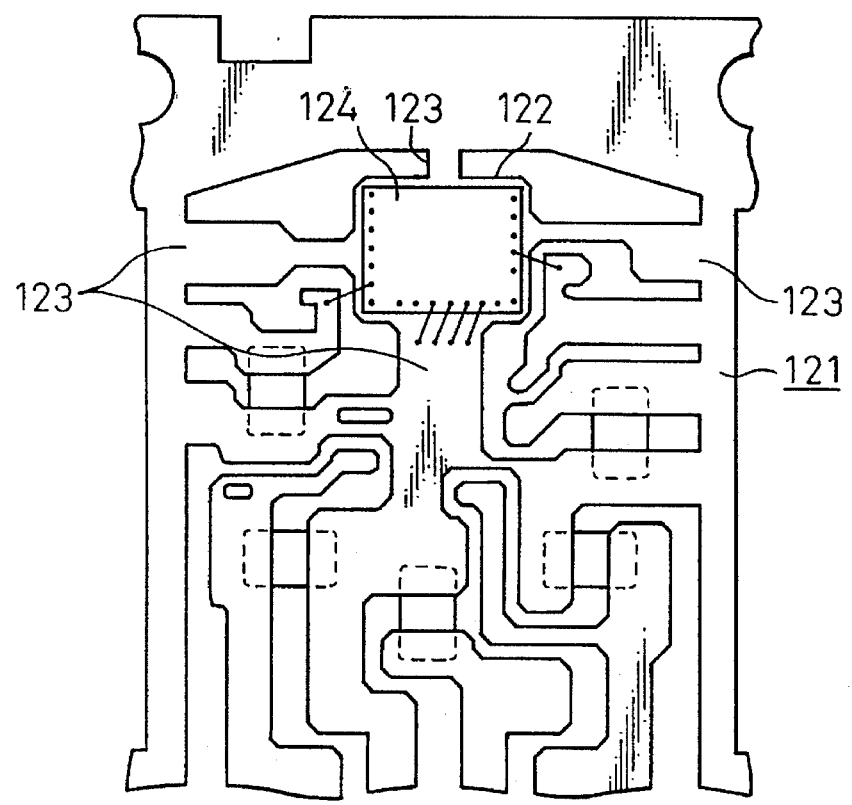
FIG. 44 is a plan view showing the construction of a leadframe according to the prior art.

FIG. 43 shows the construction of a magnetic detection device, and FIG. 44 shows the construction of a lead frame used in the magnetic detection device.

In FIG. 44, the lead frame 121 includes an island 122. A four-way tie bar 123 (extending in the horizontal and vertical directions in the figure) is connected to the island 122, and a magnetoresistance element (IC chip) 124 is mounted on the island 122.

In the magnetic detection device 125 shown in FIG. 43, the magnetoresistance element 124 and the lead frame 121 are molded together in plastic, forming a molded IC 126. The molded IC 126 shown here is fabricated by cutting the tie bar shown in FIG. 44 after plastic-molding the lead frame 121, and a portion of the tie bar 123 is exposed on the side facing an object of detection 127. A permanent magnet 128 and a housing 129, arranged around the molded IC 126, are fitted into a cap 130.

The island 122 is set at ground potential if the IC chip is a bi-polar device, and at 5 V potential if it is a CMOS chip. The tie bar 123 is at the same potential as the island 122. The cap 130 is chassis-grounded or floated to protect the device from electromagnetic interference (EMI) and other disturbances. An insulating sheet 131 is placed between the forward end of the molded IC 126 (where the tie bar 123 is exposed) and the inside end of the cap 130.

In the magnetic detection device 125, detection sensitivity is greatly affected by the air gap between the magnetoresistance element 124 and the object of detection 127; the problem here is that detection sensitivity decreases with increasing air gap. In other words, the spacing between the endmost point of the magnetic detection device 125 and the magnetoresistance element 124 must be reduced if the air gap between the magnetoresistance element 124 and the object of detection 127 is to be made smaller, but in the magnetic detection device 125, the air gap is increased by the thickness of the insulating sheet 131, causing the degradation of detection sensitivity.

It is therefore a further object of the preset invention to provide a magnetic detection device that achieves increased detection sensitivity by reducing the air gap between the magnetoresistance element and the object of detection.

To achieve the above object, the present invention provides a magnetic detection device in which a magnetoresistance element for detecting a movement of an object of detection by sensing a change in resistance, is mounted on a lead frame and disposed facing the object of detection, the magnetoresistance element and the lead frame being molded together in an insulating plastic material, wherein the portion of the lead frame that faces the object of detection is covered with the plastic material.

In a preferred mode of the invention, the magnetoresistance element is mounted on an island in the lead frame, and a tie bar for supporting the island is arranged in a portion other than the portion facing the object of detection.

In another preferred mode of the invention, the portion of the lead frame covered with the plastic material is disposed directly opposite the object of detection.

According to the invention, the lead frame is not exposed from the plastic material in the portion thereof facing the object of detection. This eliminates the need for an additional component for insulating the lead frame which, in the prior art magnetic detection device, is exposed on the forward end face of the plastic material. As a result, the air gap between the magnetoresistance element and the object of detection can be reduced, so that the detection sensitivity of the magnetic detection device is increased.

According to one preferred mode of the invention, since there is no tie bar in the portion of the lead frame facing the object of detection, the magnetoresistance element mounted on the lead frame and molded in the plastic material can be placed closer to the object of detection.

According to the other preferred mode of the invention, since the object of detection and the covered portion of the lead frame are disposed directly opposite each other, the air gap between the magnetoresistance element mounted on the lead frame and the object of detection can be further reduced. That is, since the lead frame (or tie bar) is not exposed on the covered portion thereof where the lead frame is completely covered, excellent protectiveness against the outside environment is provided. This eliminates the need for an additional component, such as a protective cap, and thus achieves a substantial reduction in the air gap.

An example embodying the present invention will be described below with reference to the accompanying drawings.

Figure 37:
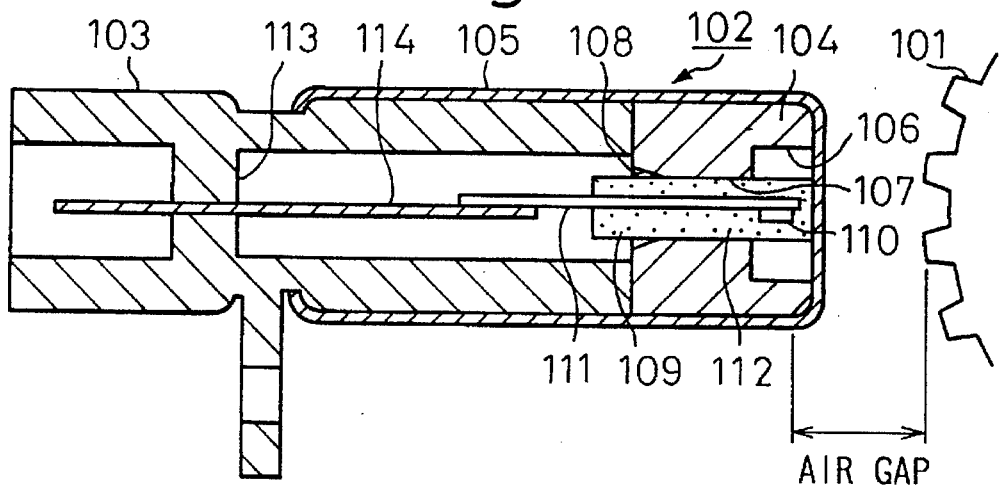
FIG. 37 is a cross-sectional view showing the entire construction of a magnetic detection device according to one embodiment.

FIG. 37 shows the entire construction of a magnetic detection device according to the present embodiment. In FIG. 37, the magnetic detection device comprises a gear-like magnetic rotor (the object of detection) 101 and a magnetic detection element 102. The magnetic rotor 101 is connected to a rotating body not shown, and the magnetic detection element 102 at the left side of the magnetic rotor 101 is mounted opposite the magnetic rotor 101 with a prescribed spacing provided therebetween.

In FIGS. 37 and 43, the magnetoresistance effective element 110 is shown as if it were patterned or formed in the direction perpendicular to the direction of rotation of the magnetic rotor (gear) 101. However, this illustration is drawn only for clarity in depicting the magnetoresistance effective element 110 and the magnetic rotor 101, respectively. As a matter of fact, the positional relationship between these two is actually the same as that shown in FIG. 32. The magnetoresistance effective element 110 of FIG. 37 corresponds to the sensing element 61 and the magnetic rotor of FIG. 37 corresponds to the gear 62 of FIG. 32.

The magnetic detection element 102 includes a plastic housing 103. The housing 103 is formed in a cylindrical shape, and to the forward end face (the rightmost end face in FIG. 37) of the housing 103 is attached a cylindrical permanent magnet 104. The permanent magnet 104 provides a biasing magnetic field directed to the magnetic rotor 101. A cap 105, cylindrical in shape and having a closed end, is crimped onto the housing 103 in such a manner as to cover the forward end face and outer circumference of the permanent magnet 104 and the forward portion of the outer circumference of the housing 103. The cap 105 is made of a 0.25-mm thick stainless steel (SUS304) which is a non-magnetic material. The permanent magnet 104 is pressed against the forward end face of the housing 103 by the cap 105.

The permanent magnet 104 has a recessed portion 106 formed in the forward end face thereof (the rightmost end face in FIG. 38), and a through hole 107 extending in a straight line from right to left in FIG. 38 is formed passing through the center of the permanent magnet 104. The rightmost end of the through hole 107 opens in the bottom of the recessed portion 106. The leftmost portion of the through hole 107 of the permanent magnet 104 is formed in a tapered portion 108 that gradually widens toward the leftmost end of the opening.

A molded IC 109 with a magnetoresistance element (IC chip) 110 encapsulated therein is inserted in the through hole 107 of the permanent magnet 104. More specifically, within the molded IC 109, the magnetoresistance element 110 is mounted on a copper lead frame 111. A portion of the lead frame 111 and the entire magnetoresistance element 110 are molded in a molding material 112 of an insulating resin (an epoxy-based resin in the present embodiment). That is, the magnetoresistance element 110 is located within the recessed portion 106 of the permanent magnet 104, and the lead frame 111 is exposed leftwardly from the molding material 112 that passes through the through hole 107.

Furthermore, the cylindrical housing 103 includes a partition 113 that partitions the interior thereof crosswise. Inserted through the partition 113 are external terminals 114 made of brass. The external terminals 114 include an output terminal, a ground terminal, a power supply terminal, etc. One end of each of the external terminals 114 is rigidly joined by welding to its associated end of the lead frame 111.

The lead frame is not necessarily covered with the molding material as shown in FIG. 37. It is essential that the outermost end of the lead frame is located at an inner position in the device with respect to the molding material.

Figure 38A:
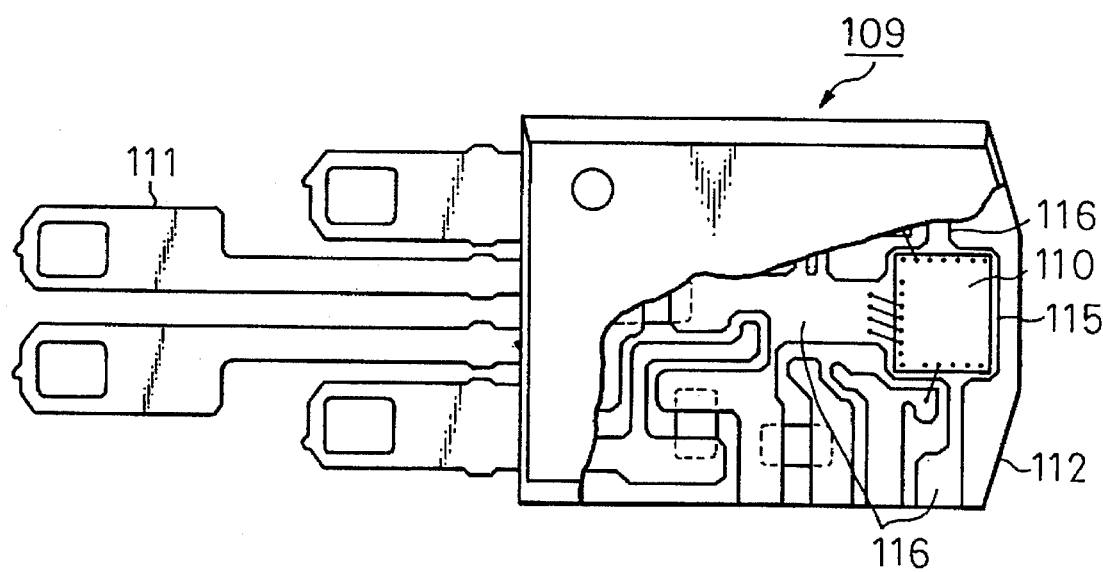
FIGS. 38(a) and 38(b) are a plan view and a side view, respectively, partially cut away to reveal the construction of a molded IC.
Figure 38B:
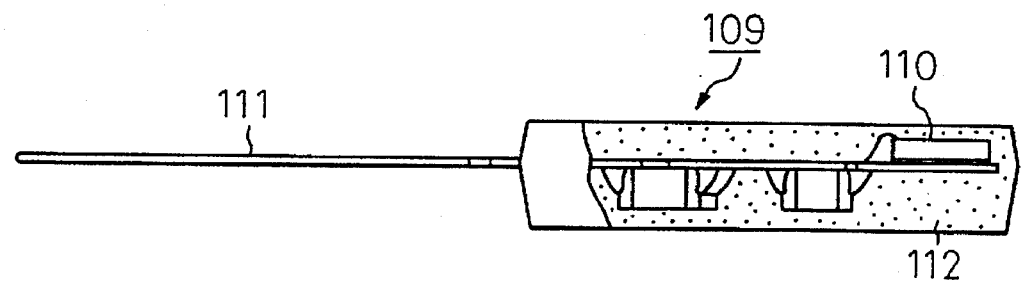
Figure 39:
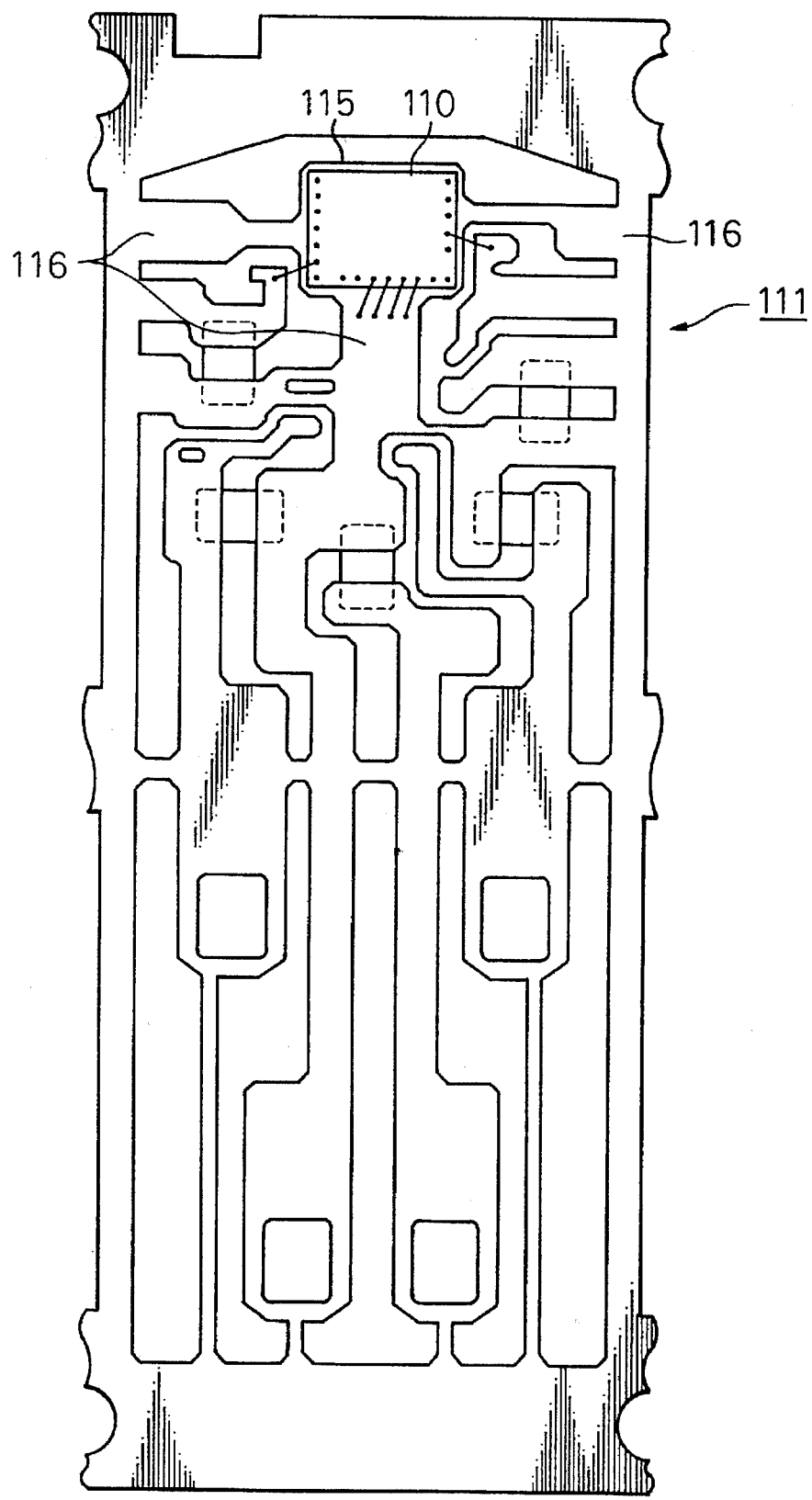
FIG. 39 is a plan view showing the construction of a leadframe.

FIGS. 38(a) and 38(b) are a plan view and a side view, respectively, partially cut away to reveal the inside of the molded IC 109. FIG. 39 is a plan view showing the entire lead frame 111 before it is molded in plastic. The molded IC 109 and the lead frame 111 will be described in detail below with reference to FIGS. 38(a), 38(b), and 39.

In FIG. 39, the lead frame 111 actually consists of a plurality of lead frame patterns formed continuously (only one pattern is shown in the figure). The lead frame 111 shown includes an island 115 formed from a flat portion, and a tie bar 116 having leads at prescribed positions for supporting the island 115. More specifically, in the lead frame 111 shown in FIG. 39, the upper end in the figure faces the magnetic rotor 101, and the island 115 is supported by the tie bar 116 from three sides thereof (from the right, left, and bottom sides in FIG. 39) other than the side facing the magnetic rotor 101. The flatness and balance of the island 115 is maintained by this three-way tie bar 116. The magnetoresistance element (IC chip) 110 is mounted on the island 115 and fixed in position with an epoxy-based conductive adhesive (Ag paste) containing Ag powder. Leads of the lead frame 114 are connected to the electrodes of the chip by wire bonding.

In fabricating the molded IC 109 shown in FIGS. 38(a) and 38(b), first the lead frame 111 of FIG. 39 is loaded into a mold, and then, a molten epoxy resin of low viscosity is introduced under pressure into the mold. After thermosetting, the lead frame 111 is cut and is separated element by element, to complete the fabrication of the molded IC 109.

In the molded IC 109 shown in FIGS. 38(a) and 38(b), since no tie bar is provided in the side thereof facing the magnetic rotor 101 (the right-hand side in FIGS. 38(a) and 38(b)), that facing side is completely covered by the molding material 112. That is, when the molded IC 109 is assembled into the magnetic detection element 102, as shown in FIG. 37, the forward end (rightmost end in FIG. 37) of the molded IC 109 is insulated from the inside end of the cap 105 by the presence of the molding material 112. In this case, if the island 115 (tie bar 116) of the lead frame 111 is set at 5 V potential and the cap 105 at chassis ground, the insulation between the molded IC 109 and the cap 105 will not be impaired, since the molding material 112 can provide sufficient insulation. Furthermore, in the magnetic detection element 102 of FIG. 37, the spacing between its forward end and the magnetoresistance element 110 is determined only by the thicknesses of the molding material 112 and cap 105 located forwardly of the magnetoresistance element 110; as a result, the air gap is reduced, compared to the prior art magnetic detection device requiring an insulating sheet as an additional component.

The magnetic detection device having the above-described construction provides the effects and advantages hereinafter described. That is, in detecting the rotation of the magnetic rotor 101, a biasing magnetic field is being applied from the permanent magnet 104 toward the magnetic rotor 101, and the change in the biasing magnetic field caused by the rotation of the magnetic rotor 101 is translated by the magnetoresistance element 110 into a change in resistance.

By sensing the change in the resistance value of the magnetoresistance element 110, the change in the biasing magnetic field is detected, thereby detecting the rotating condition of the magnetic rotor 101.

Figure 40:
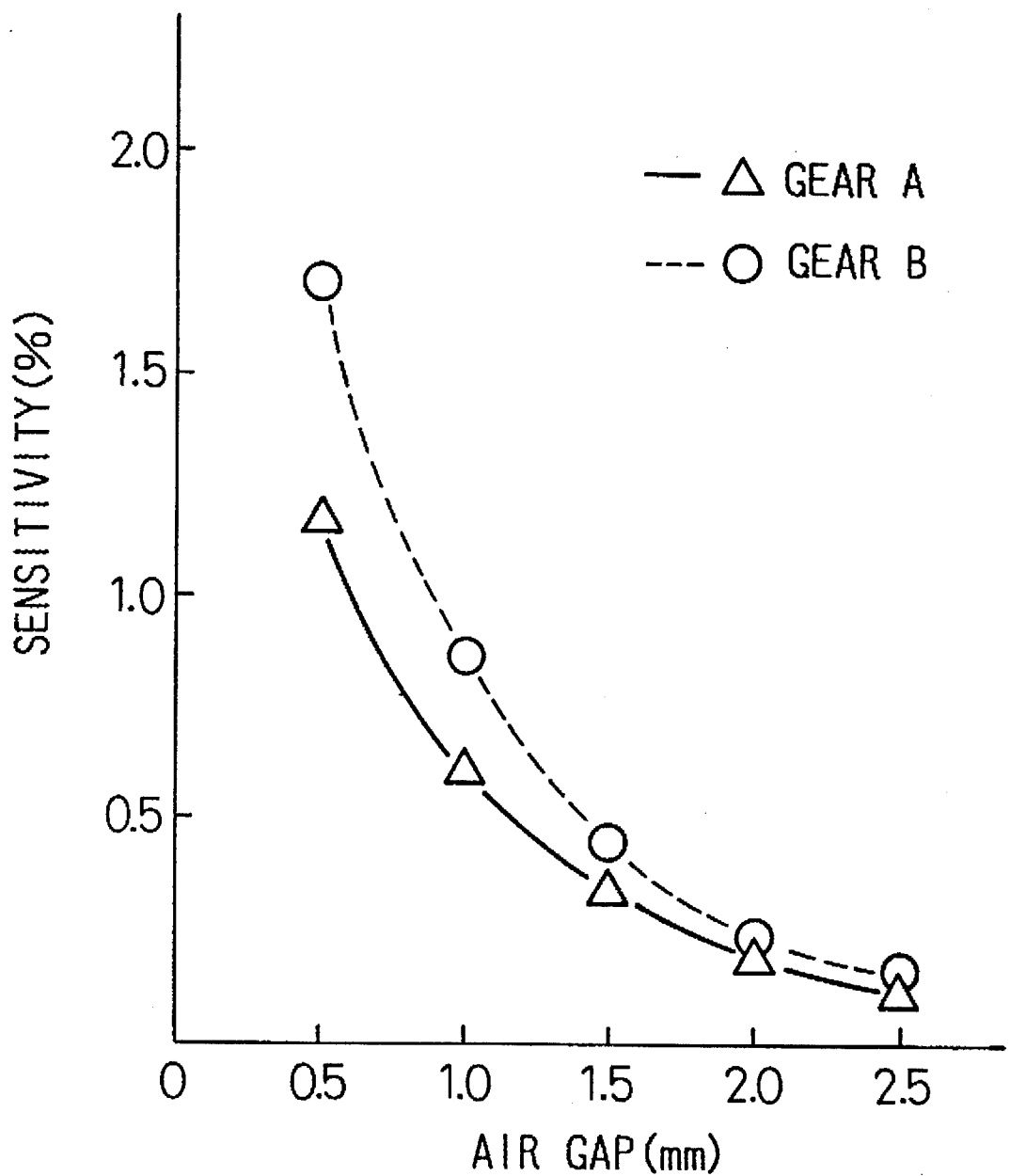
FIG. 40 is a chart plotting sensitivity as a function of the air gap between a magnetoresistance element and a magnetic rotor.

According to the construction of the present embodiment, since the air gap between the magnetoresistance element 110 and the magnetic rotor 101 can be controlled at a small constant value, high detection sensitivity can be obtained in detecting the rotation of the magnetic rotor 101. As can be seen from FIG. 40 illustrating the relationship between the air gap and the sensitivity of the magnetoresistance element 110, the sensitivity is strongly dependent on the air gap, and as the air gap is reduced, the sensitivity increases and the detection performance improves. (In FIG. 40, gear A is a rotor with small tooth pitch, and gear B a rotor with large tooth pitch.) Accordingly, in the construction that permits a reduction in the spacing between the forward end of the molded IC 109 and the inside end of the cap 105, as in the present embodiment, the air gap can be reduced by reducing the above-mentioned spacing. This enhances the detection performance of the magnetic detection element 102.

Next, a modified example of the above embodiment will be described with reference to FIGS. 41 and 42.

Figure 41:
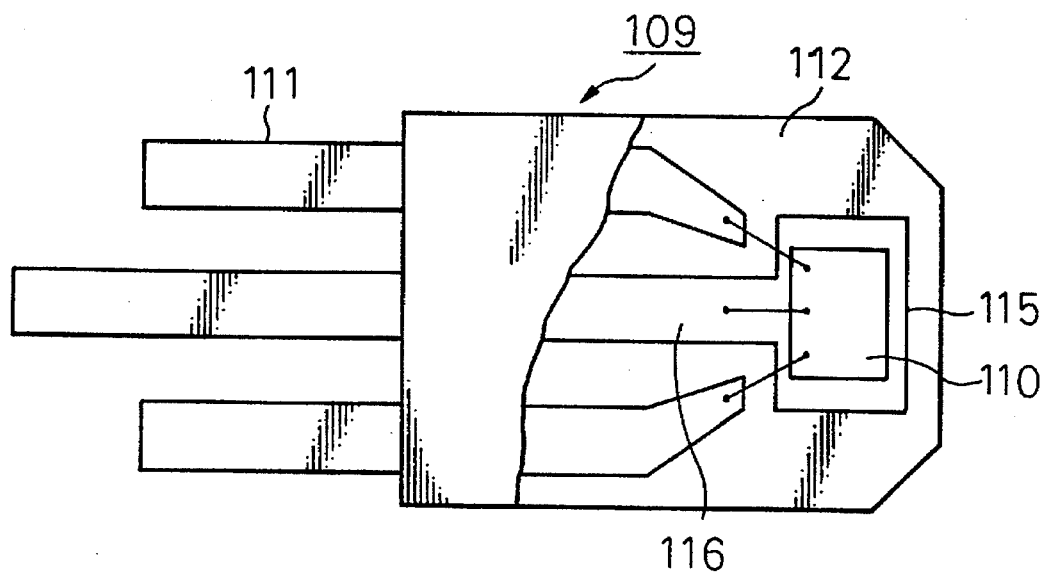
FIG. 41 is a plan view showing the construction of a molded IC according to another embodiment.

In the molded IC 109 shown in FIG. 41, the island 115 in the lead frame 111 is provided with a tie bar 116 only on one side thereof (on the left side in FIG. 41), and the tie bar 116 is exposed through the opposite side of the molding material 112 from the side thereof facing the magnetic rotor 101. That is, in this molded IC 109, the entire portion, except the opposite side (left side in FIG. 41) from the side facing the magnetic rotor 101, is covered with the molding material 112, making the covered portion completely free from defects due to water penetration, erosion, etc. caused because of the exposure of the tie bar.

Figure 42:
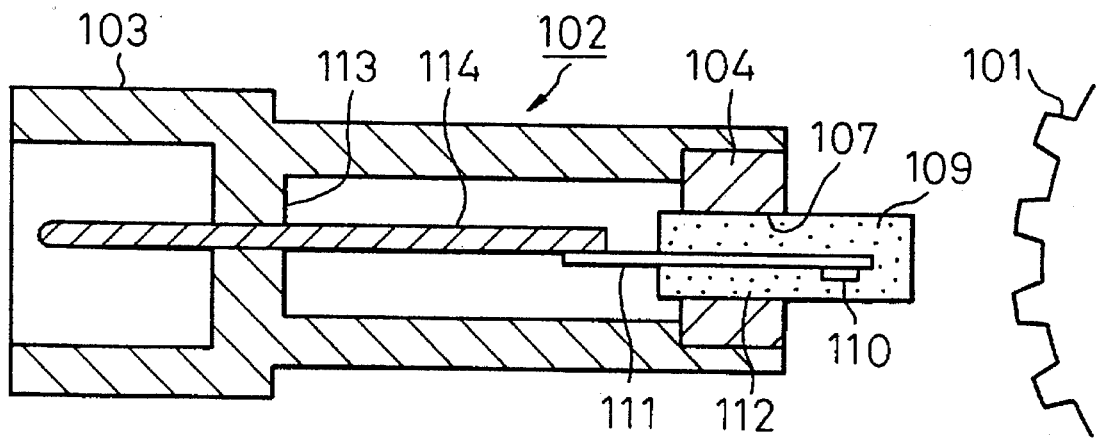
FIG. 42 is a cross-sectional view showing the construction of a magnetic detection device according to the same embodiment.

In constructing the magnetic detection element 102 using the molded IC 109 of FIG. 41, the construction shown in FIG. 42 can be employed for applications that do not require magnetic shielding. In FIG. 42, a permanent magnet 104 is housed in the forward end portion of a housing 103, and the molded IC 109 is mounted in a through hole 107 opened in the permanent magnet 104. In this construction, the molded IC 109 is mounted in such a manner as to protrude forwardly of the forward end faces of the housing 103 and the permanent magnet 104 so that the molded IC 106 is the closest to the magnetic rotor 101.

More specifically, since the molded IC 109 of the construction shown in FIG. 41 provides excellent protectiveness against the outside environment (excellent water and corrosion resistance), the molded IC 109 can be arranged in such a manner that the portion thereof where the tie bar is not exposed is exposed to the outside. Compared to the foregoing embodiment (FIG. 37), this arrangement can eliminate the need for a cap interposed between the magnetoresistance element 110 and the magnetic rotor 101, and thus achieves a further reduction in the air gap. This construction also facilitates the alignment of the magnetic detection element 102 relative to the magnetic rotor 101 in the fixture for magnetic detection.

Other modifications are possible in the present invention. For example, in the construction of the foregoing embodiment, the island 115 in the lead frame 111 is supported by a three-way or one-way tie bar 116, but it would be possible to support it from four sides, as in the construction of the prior art (shown in FIG. 44). In that case, first the magnetoresistance element is mounted on the island supported by a four-way tie bar. Then, after cutting off the portion of the tie bar that faces the magnetic rotor 101, the lead frame is molded in plastic. This construction not only achieves a reduction in the air gap, as in the foregoing embodiment, but also provides a balanced and stable mounting for the magnetoresistance element.

Furthermore, in the construction shown in FIG. 39, the tie bar 116 connected to the island 115 in the lead frame 111 may be made symmetrical in shape with respect to the centerline of the lead frame pattern. In this case, the balance of the island 115 can be maintained. Further, in the construction shown in FIG. 41, the tie bar may be reinforced by increasing its width or thickness.

Although the above-described examples show magnets 3 (FIG. 1) and 16 (FIG. 21) in the form of a circular column, the magnet may be in the form of quadrangular column or other forms. Similarly, the cap 45 (FIG. 29), the shield cases 73 and 74 (FIG. 32), and the cap 105 (FIG. 37) may be in the form other than a circular column, such as quadrangular column or other polygonal columns, including a form not fitting the form of the magnet. This applies in all of the examples disclosed herein.

We claim:

1. A magnetic detection device comprising:
   a biasing magnet for generating a bias magnetic field directed to an object of detection including a magnetic material, the biasing magnet having a magnetizing surface facing the object of detection;
   a magnetoresistance effective element disposed in a plane parallel to a plane defined by a direction of movement of the object of detection and by a direction of the bias magnetic field generated by the biasing magnet, the magnetoresistance effective element having a resistance changeable by the bias magnetic field in accordance with movement of the object of detection, a change in a state of the bias magnetic field being detected via the change in resistance of the magnetoresistance effective element;
   a holder, contained in a hollow portion of the biasing magnet, for holding the magnetoresistance effective element in a position between a surface of the biasing magnet and the object of detection, the magnetoresistance effective element protruding from the surface of the biasing magnet; and
   the biasing magnet having an axis between a north pole and a south pole aligned toward a point of detection on the object of detection,
   wherein a spacing between the magnetoresistance effective element and the biasing magnet corresponds to a minimum spacing which avoids turbulence of a magnetic vector due to the hollow portion of the biasing magnet.

2. A magnetic detection device according to claim 1, wherein:
   the biasing magnet has an extended portion on an end surface surrounding the hollow portion to hold the magnetoresistance effective element in abutment with a cap positioned by the extended portion of the biasing magnet.

3. A magnetic detection device according to claim 1, wherein:
   the spacing between the magnetoresistance effective element and the biasing magnet is about 1 mm.

4. A magnetic detection device according to claim 1, wherein:
   the magnetoresistance effective element is disposed at an inclination of about 45° to the direction of the bias magnetic field.

5. A magnetic detection device according to claim 1, wherein:
   the biasing magnet is composed of a ferritic plastic magnet.

6. A magnetic detection device according to claim 1, wherein:
   the magnetoresistance effective element is molded in said holder, said holder having a tip cut to remove excess molding material in a marginal portion of said holder, thereby reducing a possible distance between the magnetoresistance effective element and the object of detection.

7. A magnetic detection device according to claim 6, wherein the tip is cut to expose a flat surface.

8. A magnetic detection device according to claim 1, wherein:
   the holder including the magnetoresistance effective element is enclosed in a hollow non-magnetic cap having one end closed and another end open, the holder is pressed against a rear surface of the one end of the non-magnetic cap that faces the object of detection.

9. A magnetic detection device according to claim 8, wherein:
   the biasing magnet has a through hole through which the holder is pressed against the rear surface of the one end of the non-magnetic cap that closes one end of the through hole.

10. A magnetic detection device according to claim 1, further comprising:
    a hollow magnetic shield case made of a magnetic material, said magnetic shield case containing the magnetoresistance effective element, said magnetic shield case having at least one open end and another end which faces the object of detection.

11. A magnetic detection device according to claim 1, wherein:
    the holder, in which the magnetoresistance effective element is molded, is disposed in contact with an end of a magnetic shield case, said end faces the object of detection.

12. A magnetic detection device according to claim 11, wherein:
    a substrate having the magnetoresistance effective element formed thereon is disposed on a lead frame and the magnetoresistance effective element and the lead frame are molded in an insulating resin to form a molded body in contact with a conductive cap, and the lead frame has a portion facing the object of detection, said portion is located at an inner position in the magnetic detection device with respect to the insulating resin.

13. A magnetic detection device according to claim 11, wherein a substrate having the magnetoresistance effective element formed thereon is disposed on a lead frame and the magnetoresistance effective element and the lead frame are molded in an insulating resin to form a molded body in contact with a conductive cap, and the lead frame has a portion facing the object of detection, said portion is covered with the insulating resin.

14. A magnetic detection device comprising:
    a biasing magnet for generating a bias magnetic field directed to an object of detection including a magnetic material, the biasing magnet having a magnetizing surface facing the object of detection;
    a magnetoresistance effective element disposed in a plane parallel to a plane defined by a direction of movement of the object of detection and by a direction of the bias magnetic field generated by the biasing magnet, the magnetoresistance effective element having a resistance changeable by the bias magnetic field in accordance with movement of the object of detection, a change in a state of the bias magnetic field being detected via a change in resistance of the magnetoresistance effective element; and a holder, contained in a hollow portion of the biasing magnet, for holding the magnetoresistance effective element in a position between a surface of the biasing magnet and the object of detection, the magnetoresistance effective element protruding from the surface of the biasing magnet;

a molded body including an island in a lead frame provided with a tie bar only on one side of the island, the tie bar is exposed through an opposite side of a molding material from a side facing a magnet rotor, an entire portion, except the opposite side from the side facing the magnet rotor, is covered with the molding material and wherein the biasing magnet is housed in a forward end portion of a housing and the molded body is mounted in a through hole opened in the biasing magnet in such a manner as to protrude forwardly of forward end faces of the housing and the biasing magnet so that the molded body is close to the magnetic rotor; and the biasing magnet having an axis between a north pole and a south pole aligned toward a point of detection on the object of detection.

15. A magnetic detection device comprising:

a biasing magnet for generating a bias magnetic field directed to an object of detection including a magnetic material, the biasing magnet having a magnetizing surface facing the object of detection;

a magnetoresistance effective element disposed in a plane parallel to a plane defined by a direction of movement of the object of detection and by a direction of the bias magnetic field generated by the biasing magnet, the magnetoresistance effective element having a resistance changeable by the bias magnetic field in accordance with movement of the object of detection, a change in a state of the bias magnetic field being detected via a change in resistance of the magnetoresistance effective element;

a holder, contained in a hollow portion of the biasing magnet, for holding the magnetoresistance effective element in a position between a surface of the biasing magnet and the object of detection, the magnetoresistance effective element protruding from the surface of the biasing magnet; and the biasing magnet having an axis between a north pole and a south pole aligned toward a point of detection on the object of detection, wherein:

the magnetoresistance effective element is mounted on an island of a lead frame and a tie bar for holding the island is disposed in a portion of the lead frame other than a portion facing the object of detection; and the holder, in which the magnetoresistance effective element is molded, is disposed in contact with an end of a magnetic shield case, said end faces the object of detection.

16. A magnetic detection device comprising:

a biasing magnet for generating a bias magnetic field directed to an object of detection having a magnetic material;

a magnetoresistance effective element disposed at a distance from an end surface of the biasing magnet toward the object of detection and in a plane parallel to a plane defined by a direction of movement of the object of detection and by a direction of the bias magnetic field generated by the biasing magnet, the magnetoresistance effective element having a resistance changeable by the bias magnetic field in accordance with movement of the object of detection, a change in a state of the bias magnetic field being detected via the change in resistance of magnetoresistance effective element; and the biasing magnet having a side surface on which is mounted a holder for holding the magnetoresistance effective element in a position close to a surface of the biasing magnet, the biasing magnet having an axis between a north pole and a south pole aligned toward a point of detection on the object of detection.

17. A magnetic detection device according to claim 16, wherein:

the magnetoresistance effective element is disposed at an inclination of about 45° to the direction of the bias magnetic field.

18. A magnetic detection device comprising:

a hollow columnar biasing permanent magnet having a through hole extending in an axis thereof, the biasing magnet generating a bias magnetic field directed to an object of detection made of a magnetic material; and a pair of magnetoresistance effective elements held in a tip portion of a holder made of a nonmagnetic material filling the through hole of the biasing permanent magnet, the tip portion of the holder protruding from one end of the through hole to a minimum distance necessary to avoid a magnetic turbulence prevailing in a vicinity of the ends of the through hole, the pair of magnetoresistance effective elements protruding from the biasing magnet and the pair of magnetoresistance effective elements being disposed with respective longitudinal axes of electric current inclined at respective predetermined angles to a direction of the bias magnetic field, the pair of magnetoresistance effective elements having a resistance changeable by a change in the bias magnetic field in accordance with movement of the object of detection, thereby detecting a change in a state of the bias magnetic field via the change in resistance of the magnetoresistance effective elements, the biasing magnet having an axis between a north pole and a south pole aligned toward a point of detection on the object of detection.

19. A magnetic detection device according to claim 18, wherein each of the pair of magnetoresistance effective elements is disposed at an inclination of about 45° to the direction of the bias magnetic field.

20. A magnetic detection device comprising:

a round columnar biasing permanent magnet having a rectangular through hole extending along a longitudinal axis of the round columnar biasing permanent magnet to form a hollow portion; and a sensing element molded in a head portion of a molding material in a form of a bar having a rectangular cross-section, the molding material being fittingly inserted and fixed by an adhesive in the through hole of the round columnar biasing permanent magnet, the sensing element having a chip containing two magnetoresistance effective elements protruding from one end of the through hole at a minimum distance from the through hole necessary to avoid a magnetic turbulence prevailing in a vicinity of ends of the through hole, the magnetoresistance effective elements being disposed perpendicular to a side surface of the round columnar biasing permanent magnet, in a plane containing a direction of a magnetic field of the round columnar biasing permanent magnet, the round columnar biasing permanent magnet having an axis between a north pole and a south pole aligned toward a point of detection on the object of detection.

21. A magnetic detection device comprising:

a biasing magnet having a through hole and generating a bias magnetic field directed to an object of detection made of a magnetic material;

a non-magnetic molding material inserted in the through hole; and the non-magnetic molding material and the through hole having respective tapered steps abutting each other to fix two magnetoresistance effective elements in a position protruded from a magnetizing surface of the biasing magnet at a minimum distance necessary to avoid magnetic turbulence prevailing in a vicinity of ends of the through hole, the magnetoresistance effective elements being disposed at respective inclinations of plus and minus about 45° to the direction of the magnetic field of the biasing magnet, the biasing magnet having an axis between a north pole and a south pole aligned toward a point of detection on the object of detection.

22. A magnetic detection device comprising:

a biasing magnet having a through hole and generating a bias magnetic field directed to an object of detection made of a magnetic material; and a non-magnetic molding material inserted in the through hole of the biasing magnet, and having a tip portion cut flat, for holding two magnetoresistance effective elements protruding from one end of the through hole of the biasing magnet at a minimum distance necessary to avoid magnetic turbulence prevailing in a vicinity of ends of the through hole, the magnetoresistance effective elements being disposed at respective inclinations of plus and minus about 45° to the direction of the magnetic field of the biasing magnet, the biasing magnet having an axis between a north pole and a south pole aligned toward a point of detection on the object of detection.

* * * * *